US012693709B2

(12) United States Patent
Yug

(10) Patent No.: US 12,693,709 B2
(45) Date of Patent: Jul. 28, 2026

(54) DISPLAY DEVICE AND METHOD OF MANUFACTURING THE SAME

(71) Applicant: Samsung Display Co., Ltd., Yongin-si (KR)

(72) Inventor: Geun Woo Yug, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 91 days.

(21) Appl. No.: 18/242,832

(22) Filed: Sep. 6, 2023

(65) Prior Publication Data

US 2023/0418337 A1     Dec. 28, 2023

Related U.S. Application Data

(62) Division of application No. 17/154,557, filed on Jan. 21, 2021, now Pat. No. 11,775,020.

(30) Foreign Application Priority Data

Apr. 27, 2020     (KR) ........................ 10-2020-0050745

(51) Int. Cl.
  *G06F 1/16*          (2006.01)
  *H10K 59/12*        (2023.01)
  *H10K 59/80*        (2023.01)
(52) U.S. Cl.
  CPC .......... *G06F 1/1652* (2013.01); *G06F 1/1616* (2013.01); *G06F 1/1656* (2013.01);
  (Continued)
(58) Field of Classification Search
  CPC .... G06F 1/1652; G06F 1/1616; G06F 1/1656; G06F 1/1684; H10K 59/12;
  (Continued)

(56) References Cited

U.S. PATENT DOCUMENTS 6,541,730 B2     4/2003  Nam et al.
6,586,707 B2     7/2003  Boyle et al.
           (Continued)

FOREIGN PATENT DOCUMENTS

CN          106583943 A      4/2017
CN          106914707 A      7/2017
           (Continued)

OTHER PUBLICATIONS

NonFinal Office Action issued Dec. 30, 2022, in U.S. Appl. No. 17/154,557.

(Continued)

*Primary Examiner* — S. Behrooz Ghorishi
(74) *Attorney, Agent, or Firm* — CANTOR COLBURN LLP

(57)          ABSTRACT

A method of manufacturing a display device includes providing a primary member of a display panel having a display surface and a non-display surface, a shock absorber disposed on the display surface, and a polymer base disposed on the non-display surface, cutting the primary member by irradiating the primary member with a laser along a cutting line of one surface of the polymer base without cutting through an outer surface of the shock absorber, and physically tearing off an outer surface of the shock absorber to form a final member without the laser. During laser irradiation, the primary member moves in one direction, and simultaneously a laser oscillator to which the laser is applied moves along the cutting line. The scanning speed of the laser oscillator is about 1 m/s to about 7 m/s.

7 Claims, 28 Drawing Sheets

(52) U.S. Cl.
CPC ........... *G06F 1/1684* (2013.01); *H10K 59/12* (2023.02); *H10K 59/8791* (2023.02); *H10K 59/8793* (2023.02); *H10K 59/87* (2023.02)

(58) Field of Classification Search
CPC ........... H10K 59/8791; H10K 59/8793; H10K 59/87; H10K 71/851; H10K 50/84; B23K 2101/42; B23K 26/0622; B23K 26/38
See application file for complete search history.

(56) References Cited

U.S. PATENT DOCUMENTS

| | | | |
|---|---|---|---|
| 9,865,844 | B1 | 1/2018 | Park et al. |
| 10,326,113 | B2 | 6/2019 | Yug |
| 10,541,388 | B2 | 1/2020 | Yug |
| 10,553,831 | B2 | 2/2020 | Kim |
| 10,903,457 | B2 | 1/2021 | Cho et al. |
| 11,349,109 | B2 | 5/2022 | Kim |
| 11,877,498 | B2 | 1/2024 | Kim |
| 2002/0046997 | A1 | 4/2002 | Nam et al. |
| 2002/0088780 | A1 | 7/2002 | Boyle et al. |
| 2006/0209244 | A1* | 9/2006 | Yanagawa ........... G02F 1/13394 349/153 |
| 2018/0088392 | A1 | 3/2018 | Park et al. |
| 2018/0182983 | A1* | 6/2018 | Bae ........................... B32B 9/04 |
| 2019/0386066 | A1 | 12/2019 | Cai |
| 2024/0155930 | A1 | 5/2024 | Kim |

FOREIGN PATENT DOCUMENTS

| | | | |
|---|---|---|---|
| CN | 107545847 | A | 1/2018 |
| CN | 107919437 | A | 4/2018 |
| CN | 108155212 | A | 6/2018 |
| CN | 110824757 | A | 2/2020 |
| JP | 2017186185 | A * | 10/2017 |
| KR | 0153084 | | 11/1998 |
| KR | 10-0673073 | | 1/2007 |
| KR | 10-0829876 | | 5/2008 |
| KR | 1020160089822 | | 7/2016 |
| KR | 1020160146483 | | 12/2016 |
| KR | 1020190062667 | | 6/2019 |
| KR | 1020200019301 | A | 2/2020 |

OTHER PUBLICATIONS

Notice of Allowance issued May 22, 2023, in U.S. Appl. No. 17/154,557.

* cited by examiner

DISPLAY DEVICE AND METHOD OF MANUFACTURING THE SAME

CROSS-REFERENCE TO RELATED APPLICATION

This application is a Division of U.S. patent application Ser. No. 17/154,557, filed Jan. 21, 2021, which claims priority from and the benefit of Korean Patent Application No. 10-2020-0050745, Apr. 27, 2020, which is hereby incorporated by reference for all purposes as if fully set forth herein.

BACKGROUND

Field

Embodiments of the invention relate generally to a display device and, more specifically, to a foldable display device having a polymer base layer and a method of manufacturing the same.

Discussion of the Background

The importance of display devices has increased with the development of multimedia. Accordingly, various types of display devices, such as a liquid crystal display (LCD) device and an organic light emitting diode display (OLED) device have been used. Such display devices have been diversified in application with examples focusing on various mobile electronic appliances, including for example, portable electronic appliances such as smart phones, smart watches, and tablet PCs.

Recently, a foldable display device has attracted considerable attention. The foldable display device has both advantages of a smart phone and advantages of a tablet PC because it is portable and has a wide screen.

In the foldable display device, a polymer base layer made of an organic material may be disposed behind a display panel.

The above information disclosed in this Background section is only for understanding of the background of the inventive concepts, and, therefore, it may contain information that does not constitute prior art.

SUMMARY

Applicant recognized that problems arise during manufacture of foldable display devices, e.g., in that, during the laser cutting of the foldable display device, when the polymer base layer is irradiated with a laser, heat is generated by the laser irradiation, thereby forming a carbonized region in the polymer base layer, which adversely affects folding and/or reliability of the display device.

Display devices constructed according to the principles and embodiments of the invention are capable of minimizing a carbonized region formed in the polymer base layer during manufacture by applying a laser at high speed. For example, the laser cutting operation may be performed a plurality of times with the laser having low energy density at a high scanning speed, thereby minimizing the carbonized region formed in the polymer base layer included in the display device.

Further, methods of manufacturing the display device according to the principles and embodiments are capable of minimizing damage due to heat generated in the laser cutting process during manufacturing the display device.

Additional features of the inventive concepts will be set forth in the description which follows, and in part will be apparent from the description, or may be learned by practice of the inventive concepts.

According to one aspect of the invention, a display device includes a display panel including a first surface, and a shock absorber disposed on the display surface of the display panel, the shock absorber having a second surface facing the first surface, wherein, in a first cross-section taken in a thickness direction of the shock absorber, the shock absorber includes an edge surface having a first point closest to the first surface and a second point farthest from the first surface, on outer surfaces of the shock absorber, and based on an imaginary line extending between the first and second surfaces, a first distance between the imaginary line and the first point is less than a second distance between the imaginary line and the second point.

The edge surface of the shock absorber may be recessed inwardly from the imaginary line to the inside of the shock absorber.

The edge surface may be inclined such that a distance between the inclined edge surface of the shock absorber and the imaginary line may increase as the inclined edge surface of the shock absorber may extend away from the first surface of the display panel.

The display device may further include a polarizer disposed between the display panel and the shock absorber, and a first coupling member disposed between the polarizer and the shock absorber and attaching the polarizer and the shock absorber.

The edge surface of the shock absorber may be spaced inwardly from an outer surface of the first coupling member.

The edge surface of the shock absorber and an outer surface of the first coupling member may contact each other.

The polarizer may include a polarization member having a first polarization outer surface substantially aligned with the imaginary line and a second polarization outer surface extending inwardly from the first polarization outer surface to the inside of the polarization member.

One end of the outer surface of the first coupling member may contact the second polarization outer surface, and the other end of the outer surface of the first coupling member may contact the first point of the shock absorber.

The shock absorber may include a shock absorbing member having opposed third and fourth surfaces, and the display device may further include a protect member disposed on the one of the opposed surfaces of the shock absorbing member; and a second coupling member attaching the one opposed surface of the shock absorbing member and the protective member.

The protect member may include a cover window, the second coupling member may include a window coupling member contacting the one opposed surface of the shock absorbing member, and the second point of the shock absorbing member may contact the window coupling member.

In a second cross-section taken in the thickness direction of the shock absorber, the second surface may have an outer edge substantially aligned with an outer edge of the first surface.

The display device may further include a circuit board attached to one edge of the display panel, wherein the first point and second point of the shock absorber may be disposed at one corner adjacent to the circuit board.

The inclined edge surface may include two surfaces having different inclinations.

According to another aspect of the invention, a method of manufacturing a display device includes the steps of: providing a primary member of a display panel having a display surface and a non-display surface, a shock absorber disposed on the display surface, and a polymer base disposed on the non-display surface, cutting the primary member by irradiating it with laser along a cutting line of one surface of the polymer base to form a final member, and physically tearing off an outer surface of the shock absorber to form the final member, wherein, during laser irradiation, the primary member moves in one direction, and simultaneously a laser oscillator to which the laser is applied moves along the cutting line, and the scanning speed of the laser oscillator is about 1 m/s to about 7 m/s, and the laser irradiation proceeds repetitively from a start point of the cutting line to an end point of the cutting line from about 100 times to about 200 times.

The primary member may include a primary laminate mounted on a support piece, the primary laminate may be moved by movement of the support piece, a position of the primary laminate may be determined by detecting the movement of the support piece, and the laser oscillator may move along the cutting line according to the position of the primary laminate.

During the laser irradiation, a $2n-1^{th}$ (n is a natural number) laser cutting process may be performed by applying a laser including a plurality of first laser spots along the cutting line, and a $2n^{th}$ laser cutting process may be performed by applying a laser including a plurality of second laser spots along the cutting line.

The plurality of first laser spots may be applied at regular intervals, the plurality of second laser spots may be applied at regular intervals, and an initial laser spot of the plurality of first laser spots may partially overlap an initial second laser spot of the plurality of second laser spots.

An overlapping area rate of the initial laser spot of the plurality of first laser spots and the initial laser spot of the plurality of second laser spots may be about 20% or less.

During the laser irradiation, a $3n-2^{th}$ (n is a natural number) laser cutting process may be performed by applying a laser including a plurality of first laser spots along the cutting line, a $3n-1^{th}$ laser cutting process may be performed by applying a laser including a plurality of second laser spots along the cutting line, and a $3n^{th}$ laser cutting process may be performed by applying a laser including a plurality of third laser spots along the cutting line.

The plurality of first laser spots may be applied at regular intervals, the plurality of second laser spots may be applied at regular intervals, and the plurality of third laser spots may be applied at regular intervals, an initial laser spot of the plurality of first laser spots partially may overlap an initial laser spot of the plurality of second laser spots, and the initial laser spot of the plurality of second laser spots partially may overlap an initial laser spot of the plurality of third laser spots, and an overlapping area rate of the initial laser spot of the plurality of first laser spots and the initial laser spot of the plurality of second laser spots may be about 20% or less, and an overlapping area rate of the initial laser spot of the plurality of second laser spots and the initial laser spot of the plurality of third laser spots may be about 20% or less.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the inventive concepts.

DETAILED DESCRIPTION

Figure 1:
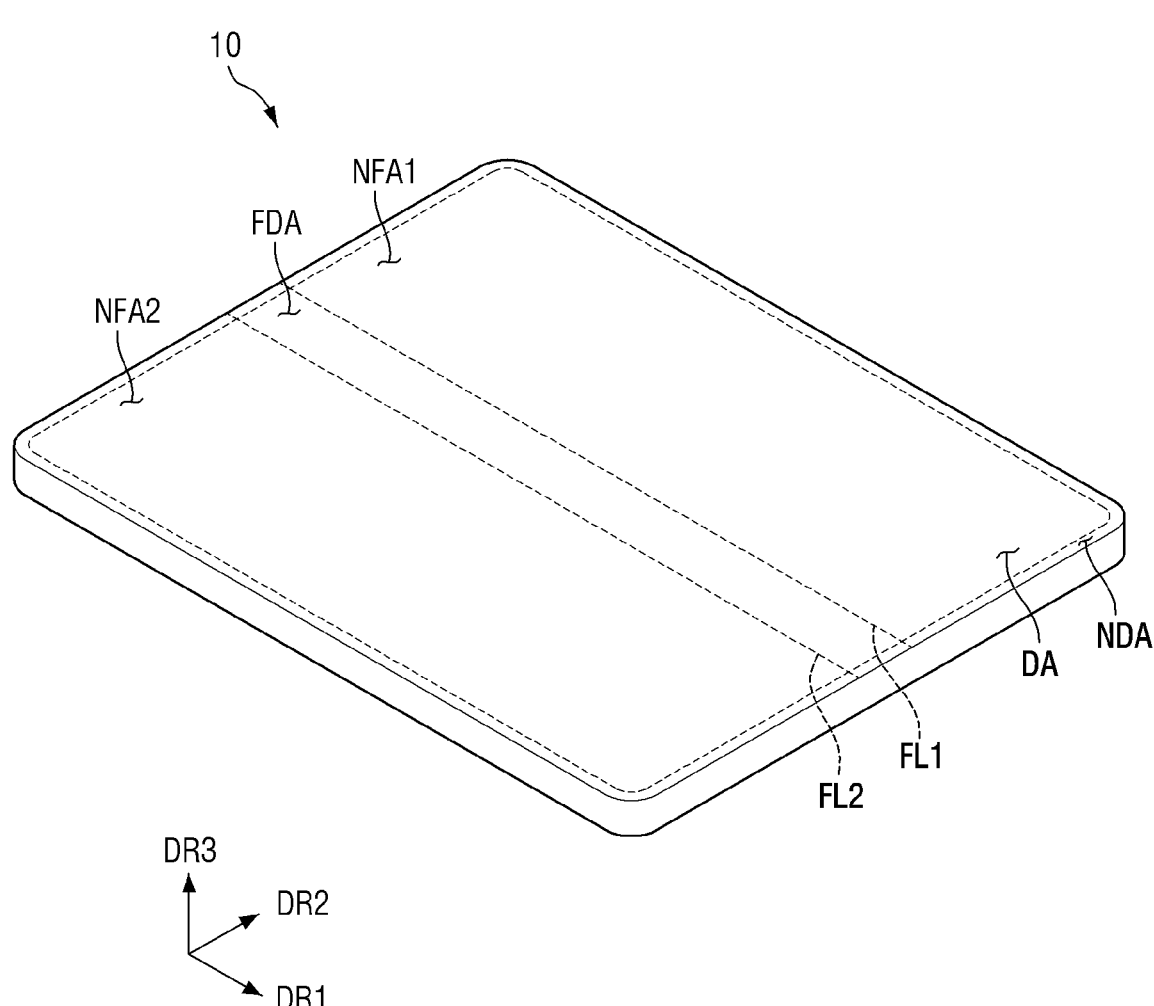
FIG. 1 is a perspective view of an embodiment of a display device constructed according to the principles of the invention showing in an unfolded position.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
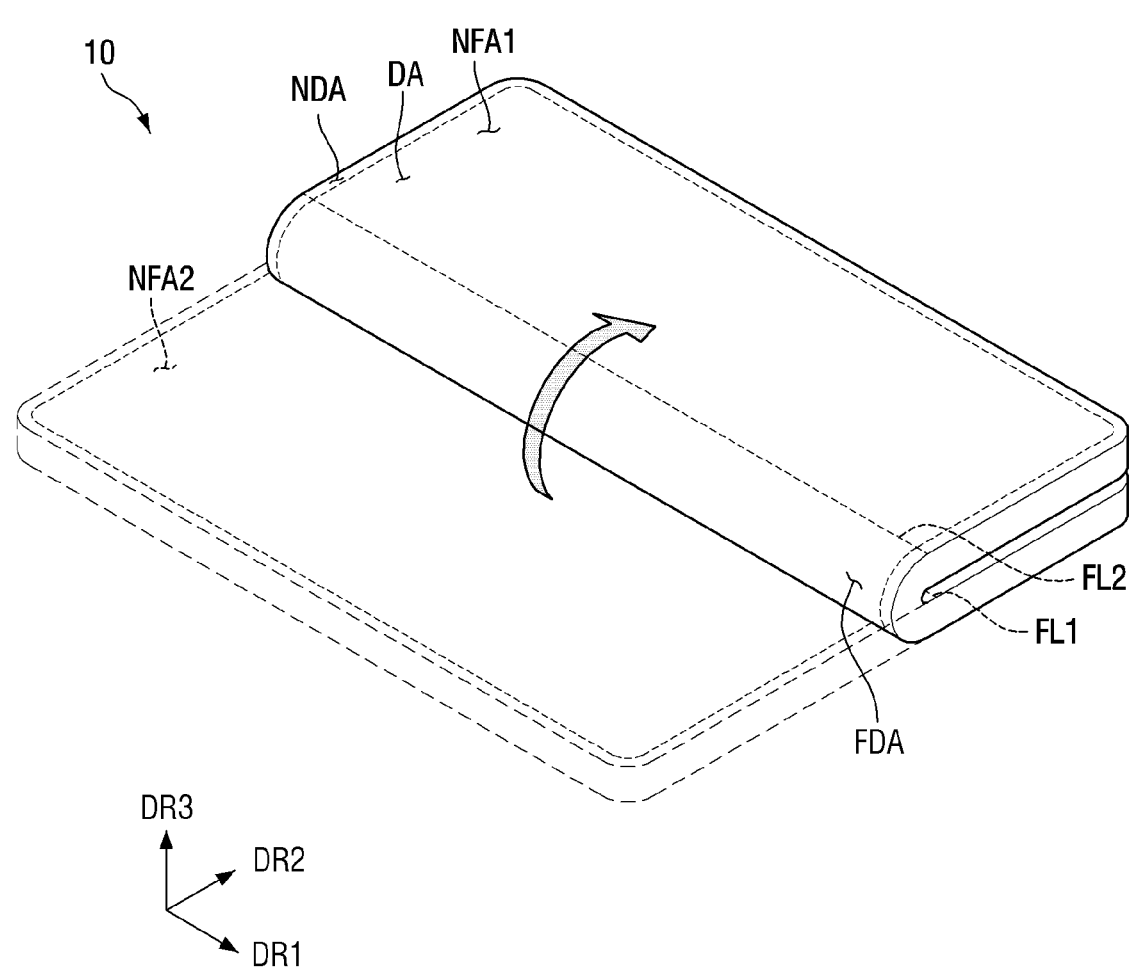
FIG. 2 is a perspective view of the display device of FIG. 1 in a folded position constructed according to the principles of the invention.

FIG. 1 is a perspective view of an embodiment of a display device constructed according to the principles of the invention showing in an unfolded position, and FIG. 2 is a perspective view of the display device of FIG. 1 in a folded position constructed according to the principles of the invention.

Referring to FIG. 1, a display device 10 may be a foldable display device. Although the display device 10 will be mainly described with reference to being applied to smart phones, the embodiments are not limited thereto. For example, the display device 10 may be applied to portable phones, tablet PCs, personal digital assistants (PDAs), portable multimedia players (PMPs), televisions, game machines, wrist-watch type electronic devices, head mount displays, monitors of personal computers, notebook computers, car navigators, car dashboards, digital cameras, camcorders, billboards, medical devices, inspection devices, various home appliances such as refrigerators and washing machines, and internet of thing devices, in addition to smart phones.

In FIGS. 1 and 2, the first direction DR1 may be a direction parallel to one side of the display device 10 when viewed on a plane, for example, may be a vertical direction of the display device 10. The second direction DR2 may be a direction parallel to the other side of the display device contacting one side of the display device 10 when viewed in plan, for example, may be a horizontal direction of the display device 10. The third direction DR3 may be a thickness direction of the display device 10.

The display device 10 may have a generally rectangular shape when the display device 10 may have a generally rectangular shape where corners are straight or a generally rectangular shape where corners are round when viewed in plan. The display device 10 may include two short sides arranged in the first direction DR1 and two long sides arranged in the second direction DR2 when viewed in plan.

The display device 10 may include a display area DA and a non-display area NDA. When viewed in plan, the shape of the display area DA may correspond to the shape of the display device 10. For example, when the display device 10 has a generally rectangular shape when viewed in plan, the display area DA may also have generally rectangular shape.

The display area DA may be an area where a plurality of pixels is provided to display an image. The plurality of pixels may be arranged in a matrix direction. Each of the plurality of pixels may have a generally rectangular shape, a rhombus shape, or a square shape when viewed in plan, but the shape thereof is not limited thereto. For example, each of the plurality of pixels may have a generally polygonal shape, a circular shape, or an elliptic shape in addition to generally rectangular, rhombus, or square shapes when viewed in plan.

The non-display area NDA may be an area where no pixel is provided so an image Is not displayer in the non-display are NDA. The non-display area NDA may be disposed around the display area DA. The non-display area NDA may be disposed to surround the display area DA as shown in FIG. 1, but the embodiments are not limited thereto. The display area DA may be partially surrounded by the non-display area NDA.

The display device 10 may maintain both a folded position and an unfolded position. As shown in FIG. 2, the display device 10 may be folded in an in-folding manner in which the display area DA is disposed inside. When the display device 10 is folded in an in-folding manner, the upper surfaces of the display device 10 may be disposed to face each other. As another example, the display device 10 may be folded in an out-folding manner in which the display area DA is disposed outside. When the display device 10 is folded in an out-folding manner, the lower surfaces of the display devices 10 may be disposed to face each other.

The display device 10 may include a folding area FDA, a first non-folding area NFA1, and a second non-folding area NFA2. The folding area FDA is an area where the display device 10 is folded. The non-folding areas NFA1 and NFA2 are areas that are not folded or bent. The first non-folding area NFA1 and the second non-folding area NFA2 may be areas where the display device 10 is not folded.

The first non-folding area NFA1 may be disposed at one side of the folding area FDA, for example, at the right side thereof. The second non-folding area NFA2 may be disposed at the other side of the folding area FDA, for example, at the left side thereof. The folding area FDA may be an area bent at a predetermined curvature. Therefore, the folding area FDA may be a boundary between the first non-folding area NFA1 and the second non-folding area NFA2.

As shown in FIGS. 1 and 2, the folding area FDA may extend in the first direction DR1, and the display device 10 may be folded in the second direction DR2. Thus, the width of the display device 10 in the second direction DR2 may be reduced to approximately half, so that the user may conveniently carry the display device 10.

The axial direction of the folding area FDA is not limited to the first direction DR1. For example, the folding area FDA may extend in the second direction DR2, and the display device 10 may be folded in the first direction DR1. In this case, the length of the display device 10 in the first direction DR1 may be reduced to approximately half. Alternatively, the folding area FDA may extend diagonally across the display device 10 between the first direction DR1 and the second direction DR2. In this case, the display device 10 may be folded in a generally triangular shape.

Although FIGS. 1 and 2 show that each of the display area DA and the non-display area NDA overlaps the folding area FDA, the first non-folding area NFA1, and the second non-folding area NFA2, the embodiments are not limited thereto. For example, each of the display area DA and the non-display area NDA may overlap at least one of the folding area FDA, the first non-folding area NFA1, and the second non-folding area NFA2.

Figure 3:
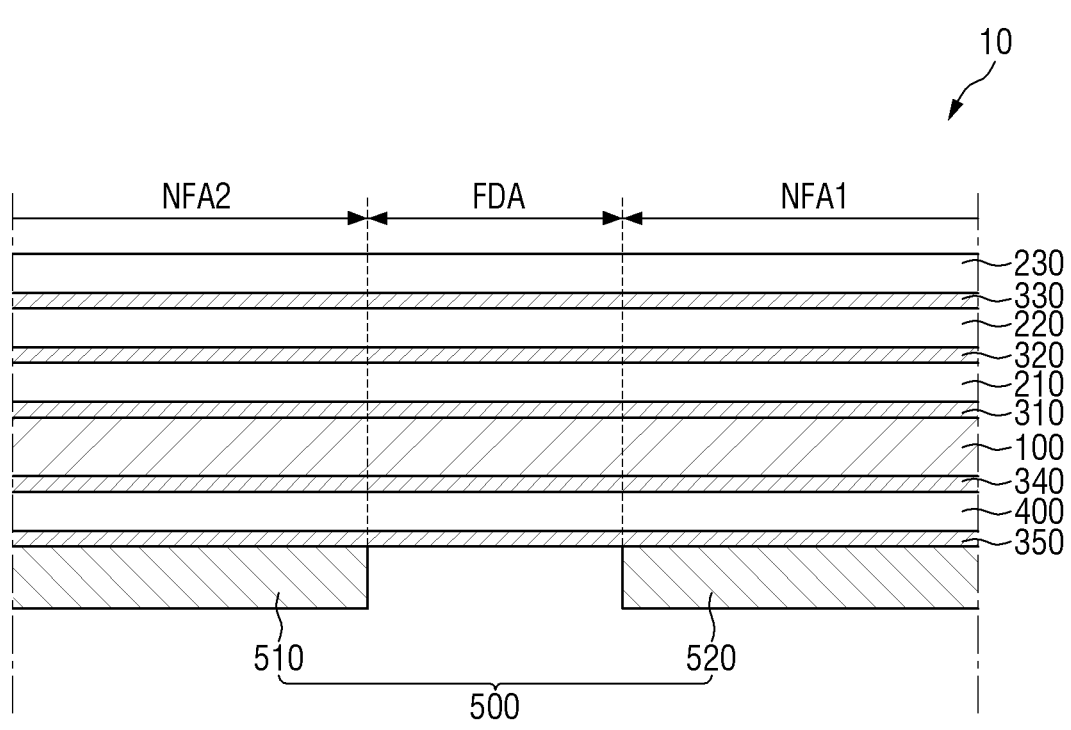
FIG. 3 is a cross-sectional view of an unfolded position of the display device of FIG. 1.
Figure 4:
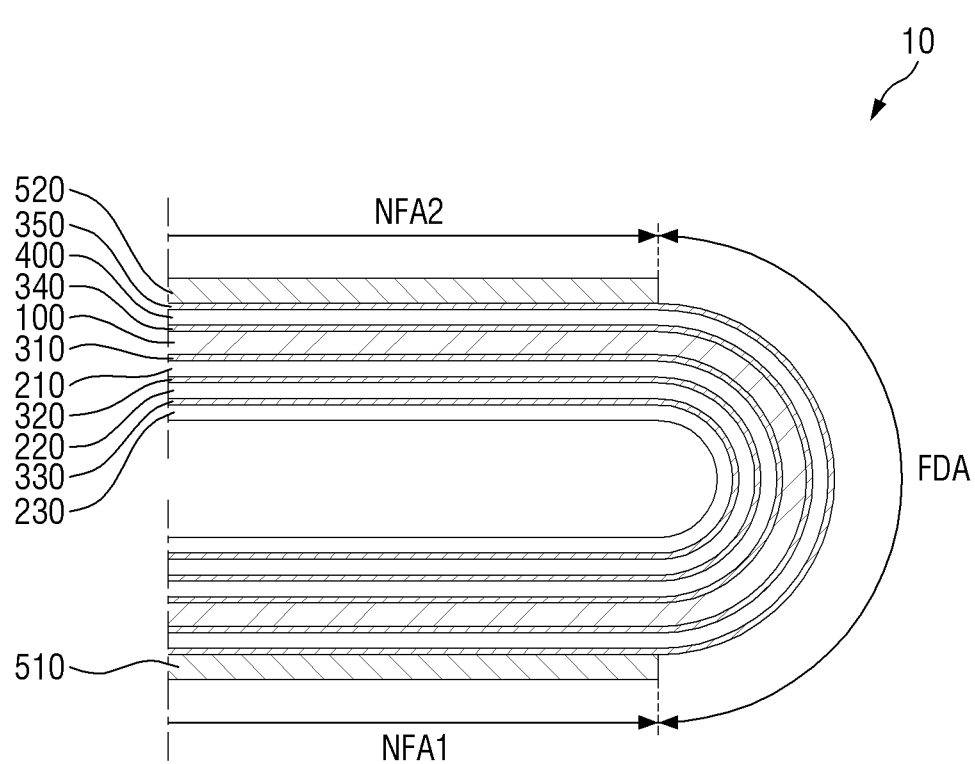
FIG. 4 is a cross-sectional view of a folded position of the display device of FIG. 2.
Figure 5:
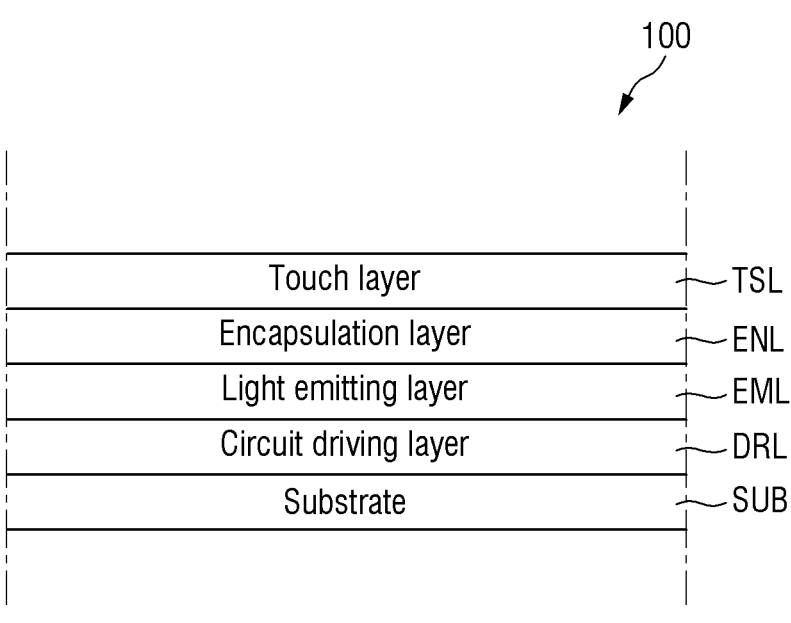
FIG. 5 is a schematic, cross-sectional view of a display panel of FIG. 3.

FIG. 3 is a cross-sectional view of an unfolded position of the display device of FIG. 1, FIG. 4 is a cross-sectional view of a folded position of the display device of FIG. 2, and FIG. 5 is a schematic, cross-sectional view of a display panel of FIG. 3.

Referring to FIGS. 3 and 4, the display device 10 may include a display panel 100, a polarizer in the form of a polarization member 210, a shock absorbers in the form of a shock absorbing member 220, a protective member in the form of a cover window 230, a base in the form of a polymer base layer 400, and a heat diffuser in the form of a heat sink member 500. The display device 10 may include at least one coupling member 310, 320, 330, 340 to attach the respective members to each other. Here, the front of the display panel 100 refers to a direction in which the display panel 100 displays a screen, and the back of the display panel refers to a direction opposite to the front of the display panel 100. One surface of the display panel 100 is located in front of the display panel 100, and the other surface of the display panel 100 is located behind the display panel 100.

The display panel 100 is a panel for displaying a screen or an image, and examples thereof may include self-light emitting display panels such as an organic light emitting display panel (OLED), an inorganic light emitting display panel (inorganic EL), a quantum dot light emitting display panel (QED), a micro LED display panel (micro-LED), a nano LED display panel (nano-LED), a plasma display panel (PDP), a field emission display panel (FED), and a cathode ray display panel (CRT); and light-receiving display panels such as liquid crystal display panel (LCD) and an electrophoretic display panel (EPD). Hereinafter, an organic light emitting display panel will be described as an example of the display panel 100, and unless otherwise specified, the organic light emitting display panel applied to the illustrative embodiment will be simply referred to as a display panel. However, embodiments are not limited to the organic light emitting display panel, and the embodiments may include other display panels listed above or known in the art may.

The display panel 100 may further include a touch sensing unit such as a touch member. The touch member may be provided as a separate panel or film from the display panel 100 and attached to the display panel 100, but may also be provided in the form of a touch layer inside the display panel 100. In the following embodiments, a case where the touch member is provided inside the display panel 100 and included in the display panel 100 is illustrated, but the embodiments are not limited thereto.

Referring to FIG. 5, the display panel 100 includes a substrate SUB, a circuit driving layer DRL on the substrate SUB, a light emitting layer EML on the circuit driving layer DRL, an encapsulation layer ENL on the light emitting layer EML, and a touch layer TSL on the encapsulation layer ENL.

The substrate SUB may be a flexible substrate including a flexible polymer material such as polyimide. Accordingly, the display panel 100 may be warped, bent, folded, or rolled. In some embodiments, the substrate SUB may include a plurality of sub-substrates overlapping in the thickness direction with a barrier layer interposed therebetween. In this case, each of the sub-substrates may be a flexible substrate.

The circuit driving layer DRL may be disposed on the substrate SUB. The circuit driving layer DRL may include a circuit for driving the light emitting layer EML of a pixel. The circuit driving layer DRL may include a plurality of thin film transistors.

The light emitting layer EML may be disposed on the circuit driving layer DRL. The light emitting layer EML may include an organic light emitting layer. The light emitting layer EML may emit light with a variety of luminance according to a driving signal transmitted from the circuit driving layer DRL.

The encapsulation layer ENL may be disposed on the light emitting layer EML. The encapsulation layer ENL may include an inorganic film or a laminated film of an inorganic film and an organic film.

The touch layer TSL may be disposed on the encapsulation layer ENL. The touch layer TSL, which is a layer for recognizing a touch input, may function as a touch member. The touch layer TSL may include a plurality of sensing areas and a plurality of sensing electrodes.

Referring to FIGS. 3 and 4 again, a polarization member 210, a shock absorbing member 220, and a cover window 230 may be disposed on one surface of the display panel 100, that is, in front of the display panel 100. The polarization member 210, the shock absorbing member 220, and the cover window 230 may be sequentially laminated from the one surface of the display panel 100, and a plurality of coupling members 310, 320, 330, and 340 may be disposed therebetween.

The polarization member 210 polarizes light. The polarization member 210 may serve to reduce the reflection of external light. The polarization member 210 may be a polarization film. The polarization film may include a polarization layer and a protective substrate sandwiching the polarization layer from the top and bottom thereof. The polarization layer may include polyvinyl alcohol. The polarization layer may be stretched in one direction. The stretching direction of the polarization layer may be an absorption axis, and the direction perpendicular thereto may be a transmission axis. The protective substrate may be disposed on one surface and the other surface of the polarizing layer. The protective substrate may be made of a cellulose resin such as triacetyl cellulose, a polyester resin, or the like, but the material thereof is not limited thereto.

The shock absorbing member 220 may be disposed in front of the polarization member 210. The shock absorbing member 220 may serve to protect the display device 10 from external shock. The shock absorbing member 220 may include a transparent material. The shock absorbing member 220 may include the transparent material, thereby increasing a light emission rate of light emitted from the display panel 50 toward the outside. The transparent material may include a transparent organic insulating material. The transparent organic insulating material may include polyethylene terephthalate (PET) or polyimide (PI).

The cover window 230 may be disposed in front of the shock absorbing member 220. The cover window 230 serves to protect the display panel 100. The cover window 230 may be made of a transparent material. The cover window 230 may be made of, for example, glass or plastic.

When the cover window 230 includes glass, the glass may be ultra-thin glass (UTG) or thin glass. When the glass is formed as an ultra-thin film or a thin film, it has flexible properties, and may thus be warped, bent, folded, or rolled. The thickness of the glass may be, for example, in the range of about 10 μm to about 300 μm, and specifically, glass having a thickness of 30 μm to 80 μm or about 50 μm may be applied. The glass of the cover window 230 may include soda lime glass, alkali alumino silicate glass, borosilicate glass, or lithium alumina silicate glass. The glass of the cover window 320 may include chemically reinforced or thermally reinforced glass to have strong strength. The chemical reinforcement may be achieved through an ion exchange treatment process in an alkali salt. The ion exchange treatment process may be performed two or more times.

When the cover window 230 includes plastic, it may be more advantageous for the plastic material to have flexible properties that facilitate folding. Examples of the plastic materials applicable to the cover window 230 may include, but are not limited to, polyimide, polyacrylate, polymethylmethacrylate (PMMA), polycarbonate (PC), polyethylenenaphthalate (PEN), polyvinylidene chloride, polyvinylidene difluoride (PVDF), polystyrene, ethylene-vinyl alcohol copolymers, polyethersulfone (PES), polyetherimide (PEI), polyphenylene sulfide (PPS), polyallylate, triacetyl cellulose (TAC), and cellulose acetate propionate (CAP). The plastic cover window 230 may be formed of one or more of the plastic materials listed above.

In some embodiments, a cover window protection layer may be disposed in front of the cover window 230. The cover window protection layer may perform at least one function of scattering prevention, shock absorption, imprint prevention, fingerprint prevention, and anti-glare of the cover window 230. The cover window protective layer may include a transparent polymer film. The transparent polymer film may include at least one of polyethylene terephthalate (PET), polyethylene naphthalate (PEN), polyether sulfone (PES), polyimide (PI), polyarylate (PAR), polycarbonate (PC), polymethylmethacrylate (PMMA), and a cycloolefin copolymer (COC).

Referring to FIGS. 3 and 4, the coupling members 310, 320, 330, and 340 may mutually couple the display panel 100, the polarization member 210, the shock absorbing member 220, and the cover window 230. Further, the polymer base layer 400 and the heat sink member 500, which will be described later, may also be coupled to each other by the coupling member 350. The coupling members may include a window coupling member 330 for attaching the cover window 230, a shock absorbing member coupling member 320 for attaching the shock absorbing member 220, and a polarization member coupling member 310 for attaching the polarization member 210, as the members attached onto one surface of the display panel 100. The coupling members 310, 320, and 330 disposed on one surface of the display panel 100, that is, in front of the display panel 100, may be all optically transparent.

The polymer base layer 400 and the heat dissipation member 500 may be disposed on the other surface of the display panel 100, that is, behind the display panel 100.

The polymer base layer 400 may include a polymer. The polymer film layer 410 may include, for example, polyimide (PI), polyethylene terephthalate (PET), polycarbonate (PC), polyethylene (PE), polypropylene (PP), polysulfone (PSF), polymethylmethacrylate (PMMA), triacetyl cellulose (TAC), or a cycloolefin polymer (COP). The polymer film layer 410 may include a function layer on at least one surface thereof. The function layer may include, for example, a light absorbing layer. The light absorbing layer may include a light absorbing material such as a black pigment or dye. The light absorbing layer may be formed on a polymer film by coating or printing using black ink.

The heat sink member 500 may be disposed behind the polymer base layer 400. The heat sink member 500 serves to diffuse heat generated from the display panel 100 or other components of the display device 10. The heat sink member 500 may include a metal plate. The metal plate may include a metal having excellent thermal conductivity, such as copper or silver. The heat sink member 500 may be a heat sink sheet including graphite or carbon nanotubes.

The heat sink member 500 is not limited thereto, but may be separated based on the folding area FDA to facilitate the folding of the display device 10 as shown in FIGS. 3 and 4. For example, the heat sink member 500 includes a first heat sink member 510 and a second heat sink member 520. Here, the first heat sink member 510 may be disposed in the first non-folding area NFA1, and the second heat sink member 520 may be disposed in the second non-folding area NFA2. The first heat sink member 510 and the second heat sink member 520 may be physically separated from each other based on the folding area FDA.

As described above, the polymer base layer 400 and the heat sink member 500 may be mutually coupled by the coupling members 340 and 350. The coupling members may include a polymer film coupling member 40 for attaching the polymer base layer 400 and a heat sink member coupling member 350 for attaching the heat sink member 320 as the members attached onto the other surface of the display panel 100. When the heat dissipation member 500 is separated based on the folding area FDA, the heat sink member coupling member 350 may also be separated into the same shape, but may be connected as one without being separated for each of the non-folding areas NFA1 and NFA2, as shown in FIG. 3.

When the display device 10 displays an image through only the front surface thereof, among the coupling members 310, 320, 330, 340, and 350, the coupling members 340 and 350 disposed on the other surface of the display panel 100, that is, behind the display panel 100, is not necessarily optically transparent.

Each of the coupling members 310, 320, 330, 340, and 350 may include an adhesive material. Each of the coupling members 310, 320, 330, 340, 350 may include a pressure-sensitive adhesive layer. All of the coupling members may have substantially the same composition, but may have different compositions depending on the position of each coupling member and the object to be coupled. Some of the coupling members 310, 320, 330, 340, and 350 may include an optically transparent adhesive layer or an optically transparent resin. For example, the window coupling member 330 for coupling the cover window 230 to the display panel 100 may include an optically transparent adhesive layer or an optically transparent resin. However, the embodiments are not limited thereto.

Figure 6:
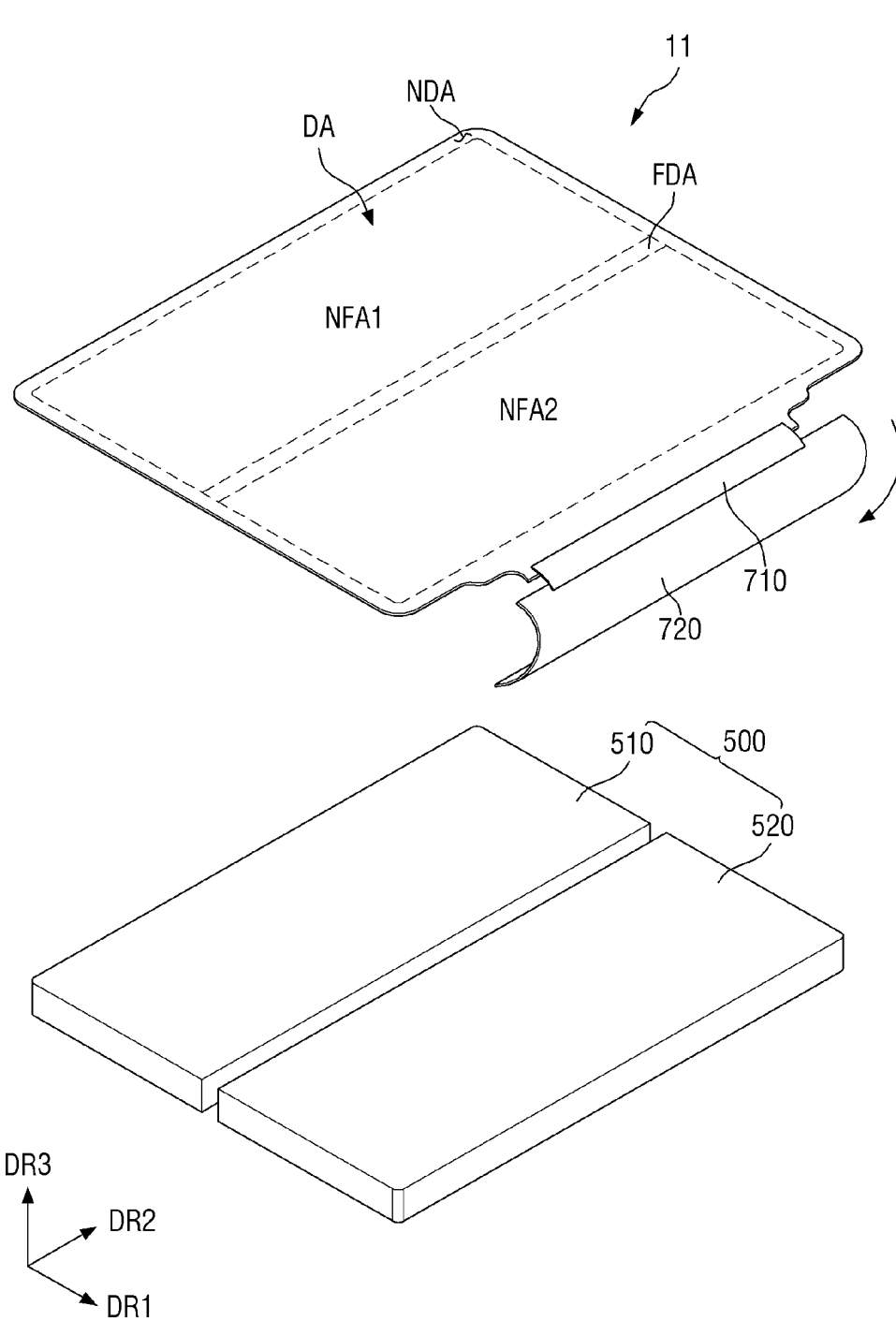
FIG. 6 is an exploded perspective view of an embodiment of a display device constructed according to the principles of the invention.

The display device 10 may be manufactured by forming a final member in the form of a final laminate 11 shown in FIG. 6 including a display panel 100, a polymer base layer 400, a polarization member 210, a shock absorbing member 220, and a cover window 230 and attaching a heat sink member 500 to one surface of the final laminate 11. Here, the final laminate 11 may be formed by first forming a primary member in the form of a primary laminate having an area greater than the size of the display device 10 and then removing one of more portions of the primary laminate 15 to create the shape of the display device 10. According to an embodiment, the display device 10 may include the final laminate 11 formed by cutting an outer portion of the primary laminate 15 with a laser.

Figure 7:
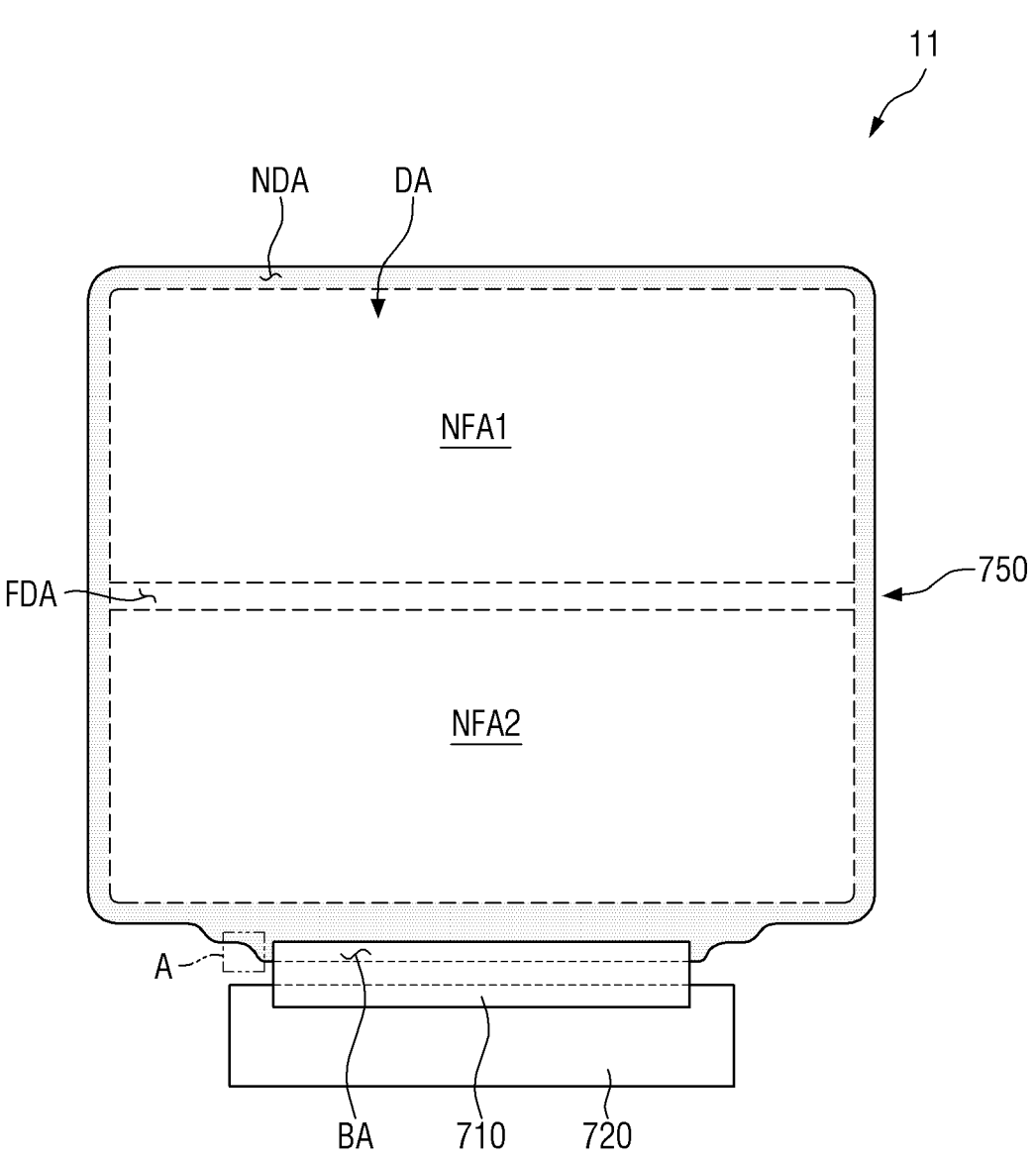
FIG. 7 is a plan view of an embodiment of the final laminate shown in FIG. 6.
Figure 8:
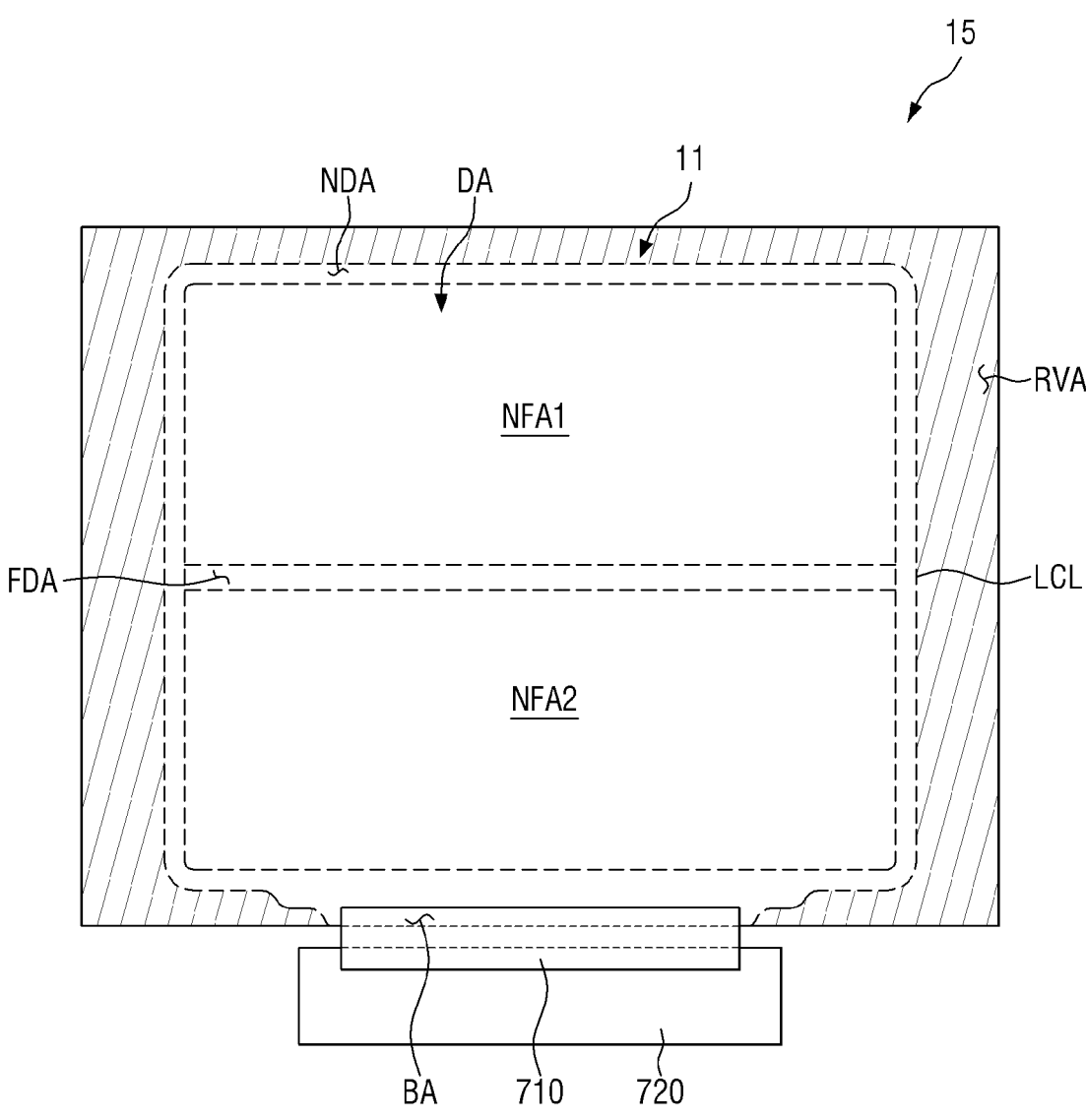
FIG. 8 is a plan view of an embodiment of one surface of a primary laminate.

FIG. 6 is an exploded perspective view of an embodiment of a display device constructed according to the principles of the invention, and FIG. 7 is a plan view of an embodiment of the final laminate shown in FIG. 6. FIG. 8 is a plan view of an embodiment of one surface of a primary laminate.

Referring to FIGS. 6 and 7, the display device 10 may include a final laminate 11 and a heat sink member 500 disposed on the lower surface of the final laminate 11. The final laminate 11 may include the display panel 100, polarization member 210, shock absorbing member 220, cover window 230, and polymer base layer 400; and the plurality of coupling members 310, 320, 330, and 340 coupling these components. The display device 10 may be manufactured by forming the final laminate 11 and then placing the heat sink member 500 on the lower surface of the final laminate 11.

Further, as shown in FIGS. 6 and 7, the final laminate 11 may include a first circuit board 710 connected to the bonding area BA of the display panel 100 and a second circuit board 720 connected to the first circuit board 710.

The final laminate 11 may include a bonding area BA, at least a portion of which protrudes from one side on which the first circuit board 710 is disposed. In the display panel 100 and the polymer base layer 400 of the final laminate 11, one side thereof protrudes from the polarization member 210, the shock absorbing member 220, and the cover window 230, and the bonding area BA may be formed in the protruding area. Unlike the polarizing member 210, the shock absorbing member 220, and the cover window 230, in the display panel 100 and the polymer base layer 400, one side thereof may partially extend in direction DR1, and may be connected to the first circuit board 710 in the bonding area BA formed on one surface of the display panel 100. Such a structure of the display panel 100 and the polymer base layer 400 may be formed in the process of manufacturing the final laminate 11 by cutting a portion of a primary laminate 15 shown in FIG. 8. Details thereof will be described later.

The first circuit board 710 may be attached onto pads provided at one edge of the display panel 100 using an anisotropic conductive film (ACF). Accordingly, lead lines of the first circuit board 710 may be electrically connected to the pads. The first circuit board 710 may be a flexible printed circuit board (FPCB), a printed circuit board (PCB), or a flexible film such as a chip on film (COF). The first circuit board 710 may be bent toward the lower portion of the display panel 100. In this case, one side of the first circuit board 710 is attached to one edge of the display panel 100, and the other side thereof is disposed under the display panel 100 to be connected to a system board on which a host system is mounted.

The second circuit board 720 may include a circuit pad area attached to one side of the first circuit board 710. A plurality of circuit pads may be disposed in the circuit pad area of the second circuit board 720 to be connected to lead lines disposed on the first circuit board 710.

As illustrated in FIG. 6, the first circuit board 710 may be bent in a direction opposite to the third direction DR3, that is, in a downward direction of the final laminate 11. The other side of the first circuit board 710 and the second circuit board 720 may be located under the heat sink member 500 of the display device 10. The lower surface of the heat sink member 500 may be coupled to the second circuit board 720 through a separate coupling member, but the embodiments are not limited thereto.

The final laminate 11 including the first circuit board 710 and second circuit board 720 connected to the bonding area BA of the display panel 100 may be prepared by cutting a portion of the primary laminate 15 shown in FIG. 8. The primary laminate 15 may include the display panel 100 formed to have a larger area than the display device 10, the polarization member 210, the shock absorbing member 220, the cover window 230, and the polymer base layer 400.

FIG. 8 is a plan view illustrating one surface of the primary laminate 15, that is, the front side of the display panel 100. Referring to FIG. 8, the primary laminate 15, similarly to the display device 10, may include what will become the display area DA, the non-display area NDA, the folding area FDA, and the non-folding areas NFA1 and NFA2, and may further include a removal area RVA located outside the non-display area NDA. As will be described later, in the process of manufacturing the display device 10, the final laminate 11 may be separated from the removal area RVA in the cutting line LCL formed along the non-display area NDA to form the primary laminate 15. In an embodiment, the removal area RVA may be separated from the primary laminate 15 through a laser cutting process to form the final laminate 11.

Referring to FIG. 7, the final laminate 11 may include an outer surface 750 formed along the outer surface of the non-display area NDA. The outer surface 750 of the final laminate 11 may be a surface cut by laser cutting. The outer surface 750 of the final laminate 11 may be a cutting line of an outer frame when the final laminate 11 is viewed in plan. According to an embodiment, the outer surface 750 of the final laminate 11 may extend to the cover window 230, the polarization member 210, the display panel 100, and the polymer base layer 400.

As described above, one surface of the final laminate 11, including the folding area FDA, can be in-folded, so that the display device 10 may be a display device that is in-foldable. The final laminate 11 may include the shock absorbing member 220 to protect the display device 10 from external impact. The final laminate 11 may be formed by applying a laser on the lower surface of the primary laminate 15 shown in FIG. 8, that is, the upper surface of the polymer base layer 400, and removing a portion of the lower surface of the primary laminate 15. Here, the polymer base layer 400 including colored polyimide may be partially carbonized by the irradiation of a laser, thereby contaminating some members of the final laminate 11. In illustrative methods of manufacturing the display device 10 according to the principles of the invention, a laser having low energy density may be applied at high speed and several times, and at least two areas may be alternately irradiated with the laser to cut the primary laminate 15, thereby reducing the contamination due to the laser even when the polymer base layer 400 includes colored polyimide. Accordingly, the display device 10 may include the outer surface of the shock absorbing member 220 recessed inwardly from the outer surface of the display panel 100.

As described above, it is shown in FIGS. 6 to 8 that the first circuit board 710 and the second circuit board 720 are disposed on one edge of the display panel 10 parallel to the folding area FDA of the display panel 10. However, embodiments are not limited thereto, and the first circuit board 710 and the second circuit board 720 may be disposed on both edges of the display panel 10 parallel to the folding area FDA. Further, the first circuit board 710 and the second circuit board 720 may be disposed on one edge of the display panel 10 intersecting the folding area FDA. In this case, in order to facilitate the folding of the display panel 10, the first circuit board 710 and the second circuit board 720 may be disposed on one side or both sides of the first non-folding area FDA1, or on one side or both sides of the second non-folding area FDA2.

Figure 9:
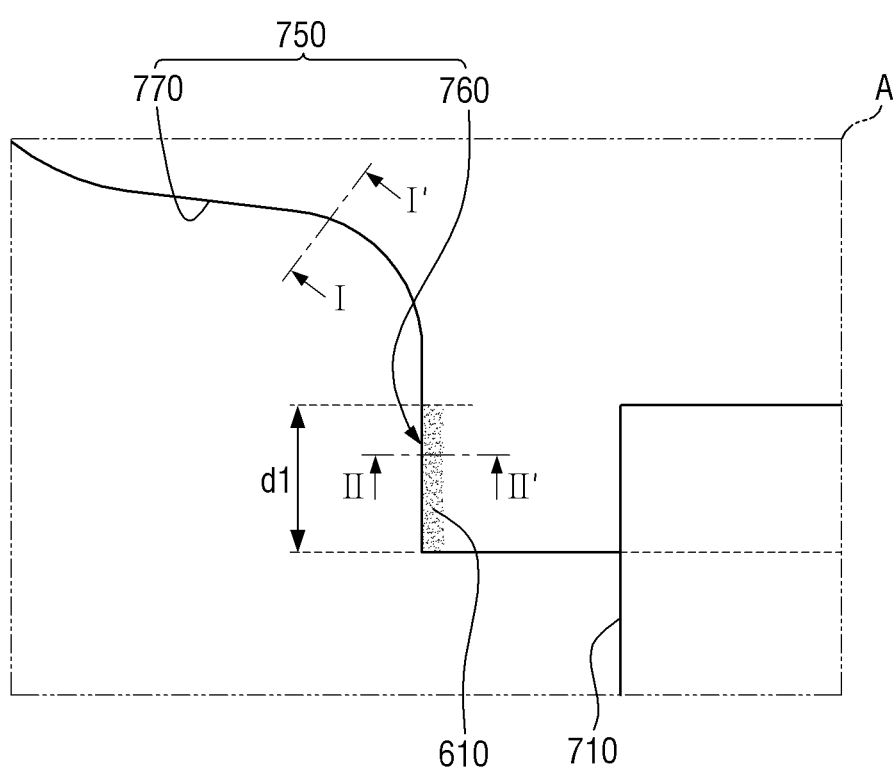
FIG. 9 is an enlarged plan view of an embodiment of the area A in FIG. 7.
Figure 11:
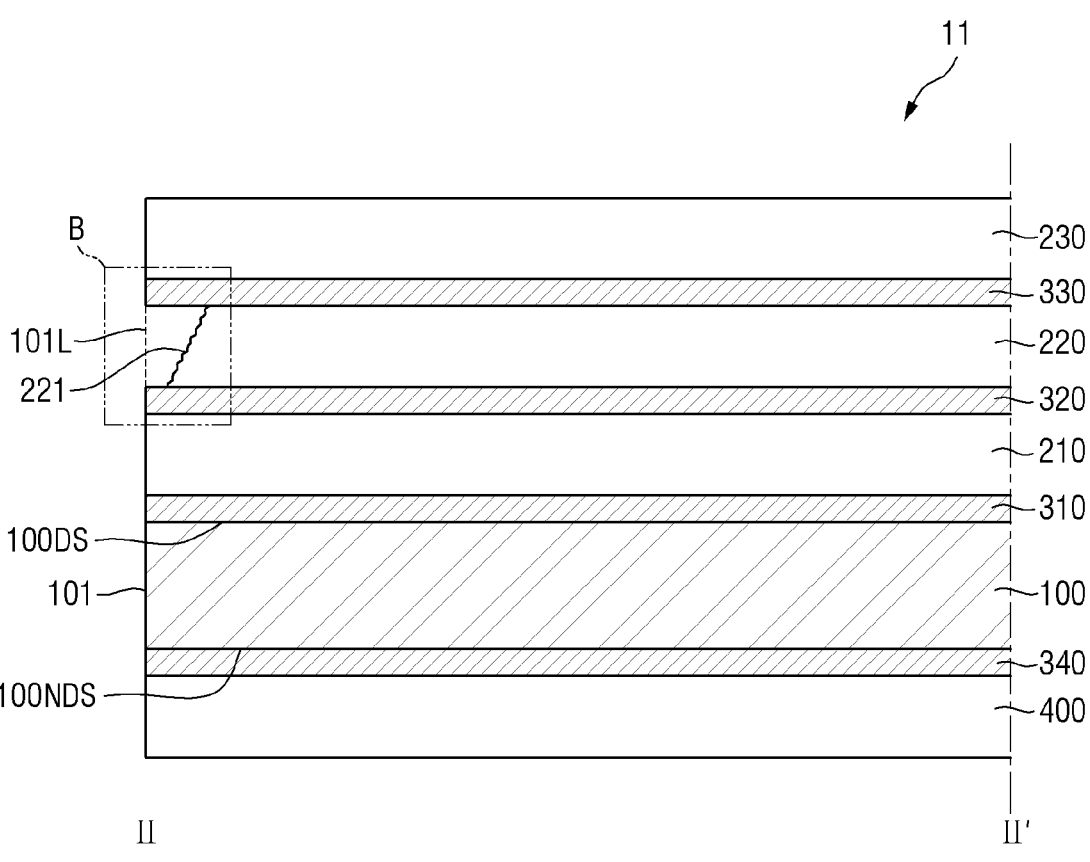
FIG. 11 is a cross-sectional view taken along line in FIG. 9.
Figure 12:
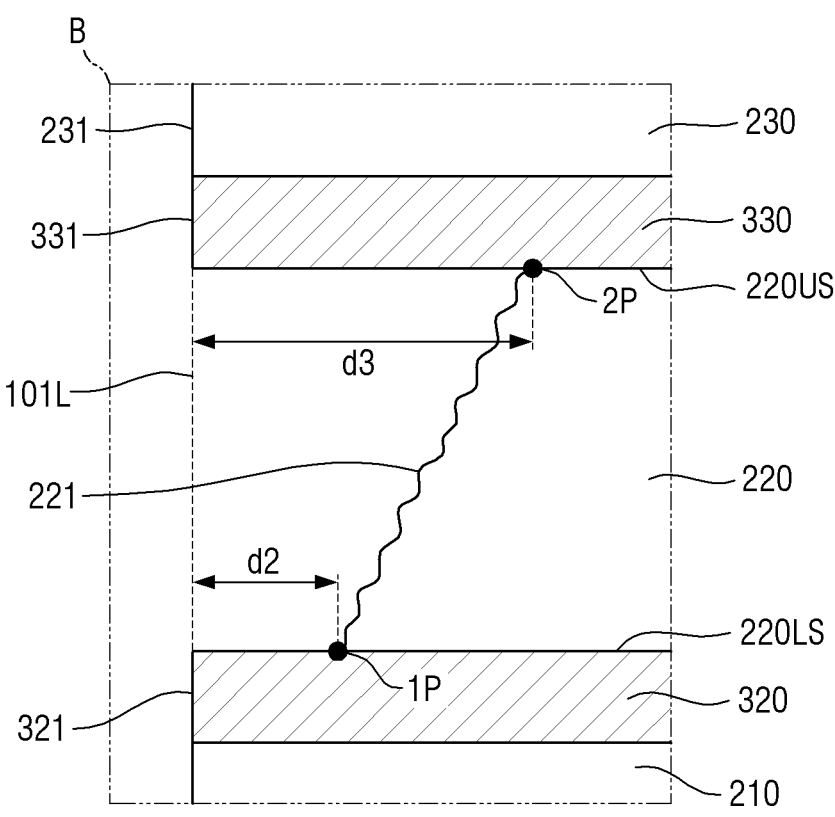
FIG. 12 is an enlarged cross-sectional view of an embodiment of the area B in FIG. 11.

FIG. 9 is an enlarged plan view of an embodiment of the area A in FIG. 7, FIG. is a cross-sectional view taken along line I-I' in FIG. 9, FIG. 11 is a schematic cross-sectional view taken along line in FIG. 9, FIG. 12 is an enlarged cross-sectional view of an embodiment of the area B in FIG. 11, and FIGS. 13 to 15 are enlarged cross-sectional views of different embodiments of the area B in FIG. 11.

Referring to FIG. 9, the outer surface 750 of the display device 10 may include a first side portion 760 and a second side portion 770. The first side portion 760 may be a portion where laser irradiation starts at the time of laser cutting. The first side portion 760 may be disposed adjacent to the bonding area BA to which the first circuit board 710 is coupled. The first side portion 760 may be disposed at one corner portion of the display device 10. The second side portion 770 may be the outer surface 750 of the display device 10 other than the first side portion 760.

The first side portion 760 may be formed according to laser spot intervals, and may be formed to have a length of 5 μm to 20 μm. In the drawings, it should be noted that the first side portion 760 is illustrated as being greatly enlarged for explanatory purposes. The first side portion 760 and the second side portion 770 may have different cross-sectional structures according to laser irradiation. Details thereof will be described below.

Figure 10:
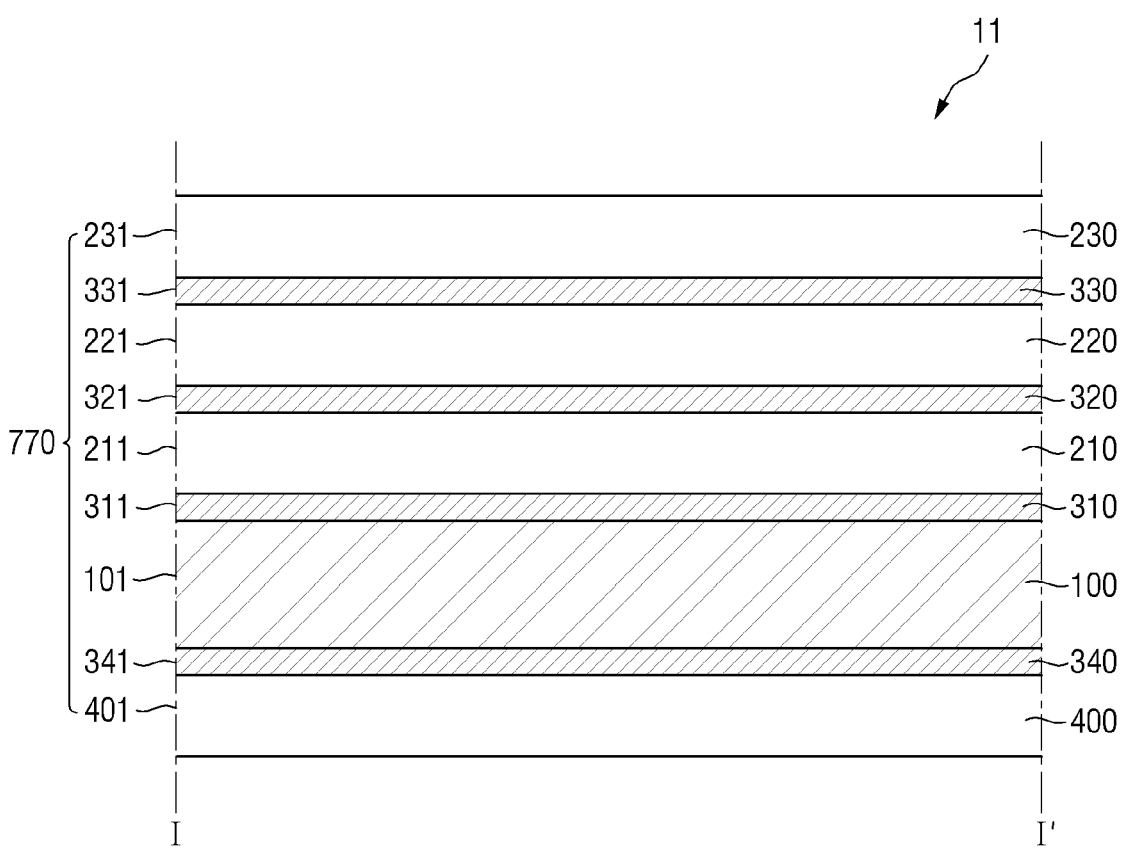
FIG. 10 is a cross-sectional view taken along line I-I' in FIG. 9.

Referring to FIG. 10, first, the second side portion 770 of the display device 10 may include an outer surface 101 of the display panel 100, an outer surface 211 of the polarization member 210, an outer surface 211 of the shock absorbing member 220, an outer surface 221 of the shock absorbing member 220, an outer surface 231 of the cover window 230, and an outer surface 401 of the polymer base layer 400. The outer surface 101 of the display panel 100, the outer surface 211 of the polarization member 210, the outer surface 211 of the shock absorbing member 220, the outer surface 221 of the shock absorbing member 220, the outer surface 231 of the cover window 230, and the outer surface 401 of the polymer base layer 400 may be surfaces cut by the aforementioned laser cutting.

The outer surface 101 of the display panel 100, the outer surface 211 of the polarization member 210, the outer surface 211 of the shock absorbing member 220, the outer surface 221 of the shock absorbing member 220, the outer surface 231 of the cover window 230, and the outer surface 401 of the polymer base layer 400 may be substantially aligned with each other. In an embodiment, in a second cross-section cut in the thickness direction of the shock absorbing member 220, the outer surface 221 of the shock absorbing member 220 may be substantially aligned with the outer surface 101 of the display panel 100.

Further, the display device 10 may include a polarization member coupling member 310 disposed between the display panel 100 and the polarization member 210, a shock absorbing member coupling member 320 disposed between the polarization member 210 and the shock absorbing member 220, a window coupling member 330 disposed between the shock absorbing member 220 and the cover window 230, and a polymer film coupling member 340 disposed between the display panel 100 and the polymer base layer 400.

The second side portion 770 of the outer surface 750 of the display device 10 may include an outer surface 311 of the polarization member coupling member 310, an outer surface 321 of the shock absorbing member coupling member 320, an outer surface 331 of the window coupling member 330, and an outer surface 341 of the polymer film coupling member 340. The outer surface 311 of the polarization member coupling member 310, the outer surface 321 of the shock absorbing member coupling member 320, the outer surface 331 of the window coupling member 330, and the outer surface 341 of the polymer film coupling member 340 may be substantially aligned with each other.

In the second side portion 770, the outer surface 101 of the display panel 100, the outer surface 211 of the polarization member 210, the outer surface 221 of the shock absorbing member 220, the outer surface 231 of the cover window 230, the outer surface 401 of the polymer base layer 400, the outer surface 311 of the polarization member coupling member 310, the outer surface 321 of the shock absorbing member coupling member 320, the outer surface 331 of the window coupling member 330, and the outer surface 341 of the polymer film coupling member 340 may be substantially aligned with each other.

Referring to FIG. 11, in the first side portion 760 of the display device, the outer surfaces of the laminated components other than the outer surface 221 of the shock absorbing member 220 may be substantially aligned with each other. In the first side portion 760, the outer surface 101 of the display panel 100, the outer surface 211 of the polarization member 210, the outer surface 231 of the cover window 230, the outer surface 401 of the polymer base layer 400, the outer surface 311 of the polarization member coupling member 310, the outer surface 321 of the shock absorbing member coupling member 320, the outer surface 331 of the window coupling member 330, and the outer surface 341 of the polymer film coupling member 340 may be substantially aligned with each other. In contrast, the outer surface 221 of the shock absorbing member 220 may be substantially aligned with the outer surface 101 of the display panel 100, the outer surface 211 of the polarization member 210, the outer surface 231 of the cover window 230, the outer surface 401 of the polymer base layer 400, the outer surface 311 of the polarization member coupling member 310, the outer surface 321 of the shock absorbing member coupling member 320, the outer surface 331 of the window coupling member 330, and the outer surface 341 of the polymer film coupling member 340.

Referring to FIG. 11, the display panel 100 may include a display surface 100DS on which an image is displayed, and a non-display surface 100NDS facing the display surface 100DS. A shock absorbing member 220 including one surface facing the display surface 100DS may be provided on the display surface 100DS of the display panel 100.

The outer surface 221 of the shock absorbing member 220 may be recessed inwardly toward the side of the display device 10 compared to the outer surface 101 of the display panel 100. Here, "inwardly" means in a direct opposite to the outside of the display device 10, and may mean the inside of the display device 10.

In an embodiment, referring to FIG. 12, in the first cross-section taken in the thickness direction of the shock absorbing member 220, the shock absorbing member 220 may include a generally inclined surface including a first point 1P of the outer surface 221 of the shock absorbing member 220, the first point 1P being closest to the display surface 100DS of the display panel 100, and a second point 2P of the outer surface 221 of the shock absorbing member 220, the second point 2P being farthest from the display surface 100DS of the display panel 100. Accordingly, the shock absorbing member 220 may include an edge surface having the first point 1P closest to the display surface 100DS and a second point 2P farthest from the display surface 100DS. With respect to an imaginary line extending in a thickness direction from the outer surface 321 of the shock absorbing member 320 to the outer surface 331 of the window coupling member 330, which is referred to herein as an extension line 101L, the distance d2 between the extension line 101L and the first point 1P may be smaller than the distance d3 between the extension line 101L and the second point 2P. For example, the extension line 101L may correspond to the cutting line LCL shown in FIG. 8. That is, as the outer surface 221 of the shock absorbing member 220 is inclined such that moving further away from the display surface 100DS of the display panel 100 increases the distance from the extension line 101L and the outer surface 221.

As shown in FIG. 12, the outer surface 221 of the shock absorbing member 220 may be recessed inwardly from the extension line 101L toward the inside of the shock absorbing member 220. The first point 1P and second point 2P of the outer surface 221 of the shock absorbing member 220 may be spaced inwardly from the extension line 101L.

The outer surface 221 of the shock absorbing member 220 is not to be cut by a laser but rather is physically torn off. Since the first side portion 760 of the display device 10 is irradiated with a laser relatively small number of times as compared with the second side portion 770 of the display device 10, the laser may not reach the shock absorbing member 220 disposed farthest from the polymer base layer 400 to which the laser is applied. Accordingly, the outer surface 221 of the shock absorbing member 220 disposed on the first side portion 760 of the display device 10 may be physically torn. However, since the first side portion 760 of the display device 10 is only a few to several tens of micrometers as described above, tearing does not produce adverse effects upon the product. Further, a laser having a low energy density may be applied a plurality of times during laser cutting. The carbonization of the polymer base layer 400 occurring during laser cutting may be reduced by applying a laser having a low energy density.

The polarization member 210 may be disposed between the shock absorbing member 220 and the display panel 100, and the shock absorbing member coupling member 320 may be disposed between the shock absorbing member 220 and the polarization member 210 to attach the shock absorbing member 220 and the polarization member 210. The shock absorbing member 220 may include one surface 220LS contacting the shock absorbing member coupling member 320.

As illustrated in FIG. 12, the outer surface 221 of the shock absorbing member 220, which is torn away, may be recessed inwardly from the outer surface 321 of the shock absorbing member coupling member 320. Further, one surface 220LS of the shock absorbing member 220 may be spaced inwardly from the outer surface 321 of the shock absorbing member coupling member 320.

The shock absorbing member 220 may include the upper surface 220US and the opposed, lower surface 220LS. The cover window 230 may be disposed on the upper surface 220US of the shock absorbing member 220, and the window coupling member 330 may be disposed between the upper surface 220US of the shock absorbing member 220 and the cover window 230. The upper surface 220US of the shock absorbing member 220 may contact the window coupling member 330.

As shown in FIG. 12, the outer surface 231 of the cover window 230 and the outer surface 331 of the window coupling member 330 may overlap any extension line 101L extending from the outer surface 101 of the display panel 100. The outer surface 221 of the shock absorbing member 220 may be recessed inwardly from the outer surface 231 of the cover window 230 and the outer surface 331 of the window coupling member 330.

In an embodiment, the first point 1P of the outer surface 221 of the shock absorbing member 220 may contact the shock absorbing member coupling member 320, and the second point 2P of the outer surface 221 of the shock absorbing member 220 may contact the window coupling member 330. With respect to any extension line 101L extending from the outer surface 101 of the display panel 100, the distance d2 between the extension line 101L and the first point 1P may be smaller than the distance d3 between the extension line 101L and the second point 2P.

Figure 13:
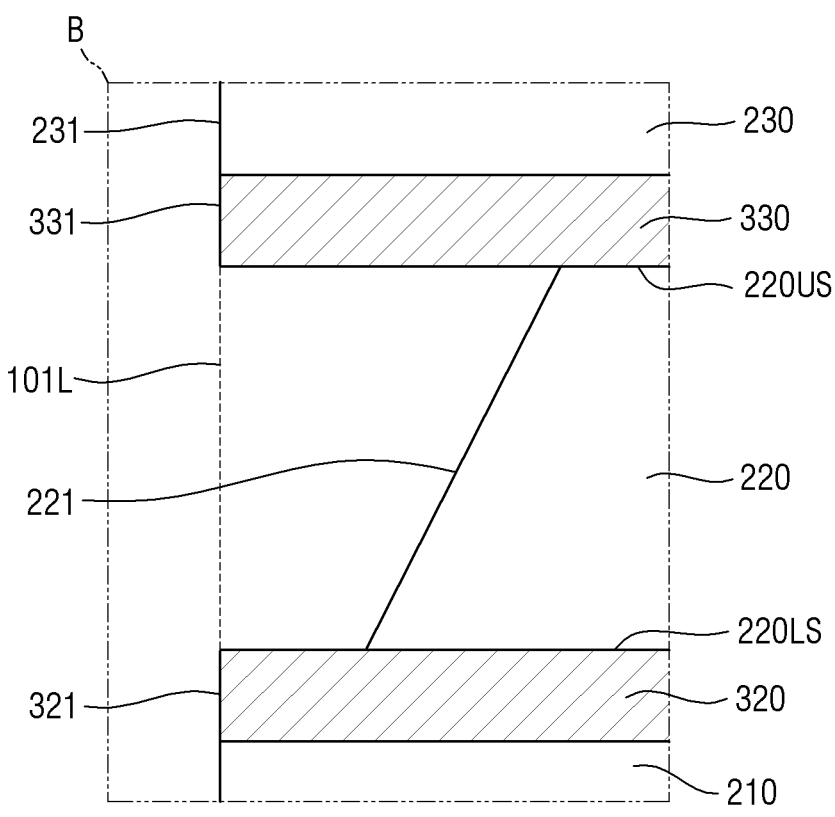
FIGS. 13 to 15 are enlarged cross-sectional views of different embodiments of the area B in FIG. 11.

As shown in FIG. 13, in another embodiment, the outer surface 221 of the shock absorbing member 220 may be formed as a substantially smooth inclined surface unlike in FIGS. 11 and 12. However, the embodiments are not limited thereto. If the outer surface 221 of the shock absorbing member 220 has a tendency to proceed inward as it is farther away from the display surface 100DS of the display panel 100, the shape of the outer surface 221 may be various and non-uniform.

Figure 14:
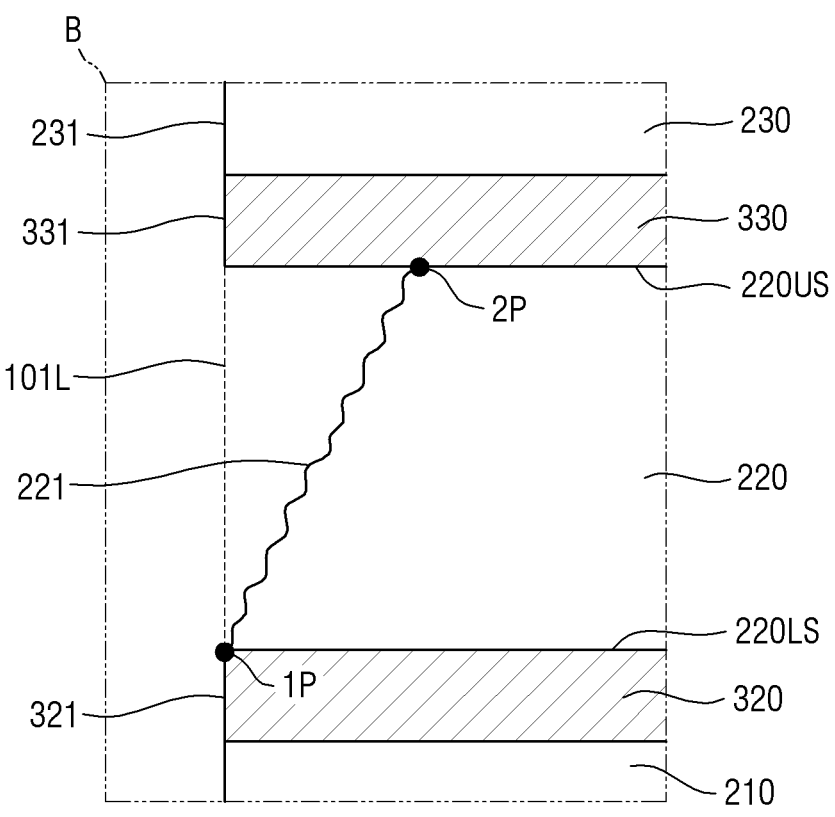

Further, as shown in FIG. 14, in another embodiment, at least a portion of the outer surface 221 of the shock absorbing member 220 may be disposed to overlap any extension line 101L extending from the outer surface 101 of the display panel 100. Specifically, the first point 1P of the outer surface 221 of the shock absorbing member 220 may be disposed to overlap the extension line 101L. In an embodiment, the distance between the first point 1P of the outer surface 221 of the shock absorbing member 220 and the extension line 101L may be 0. The second point 2P of the outer surface 221 of the shock absorbing member 220 may be spaced inward from any extension line 101L.

Figure 15:
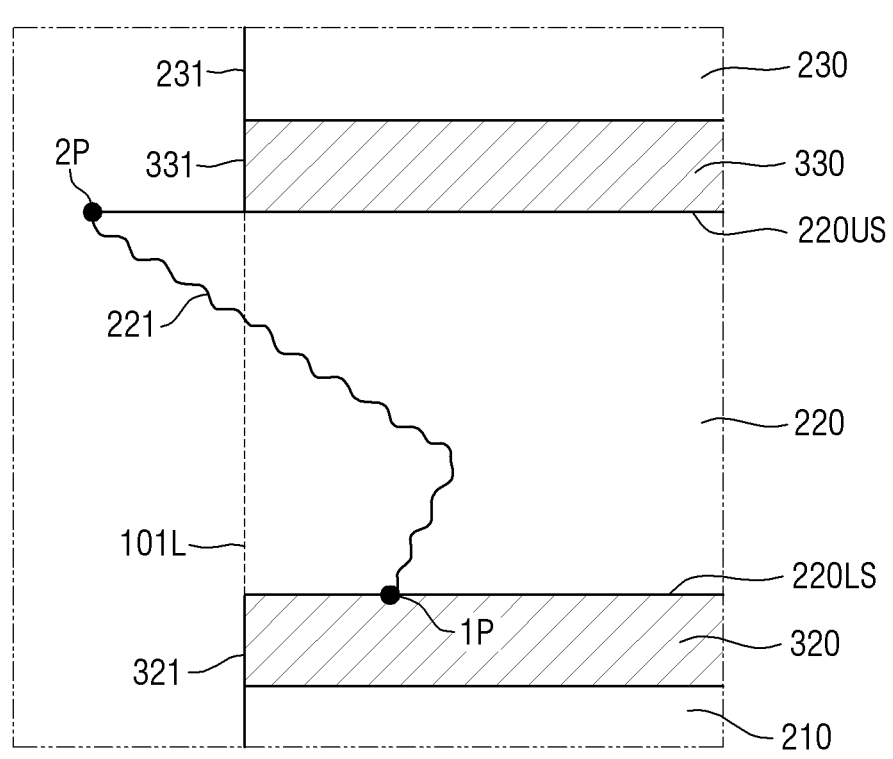

Further, as shown in FIG. 15, in still another embodiment, at least a portion of the outer surface 221 of the shock absorbing member 220 may protrude outwardly beyond any extension line 101L extending from the outer surface 101 of the display panel 100. In an embodiment, a first point 1P of the outer surface 221 of the shock absorbing member 220, the first point 1P being closest to the display surface 100DS of the display panel 100, may be disposed inwardly from the extension line 101L, and a second point 2P of the outer surface 221 of the shock absorbing member 220, the second point 2P being farthest from the display surface 100DS of the display panel 100 may be disposed outwardly from the extension line 101L.

Figure 16:
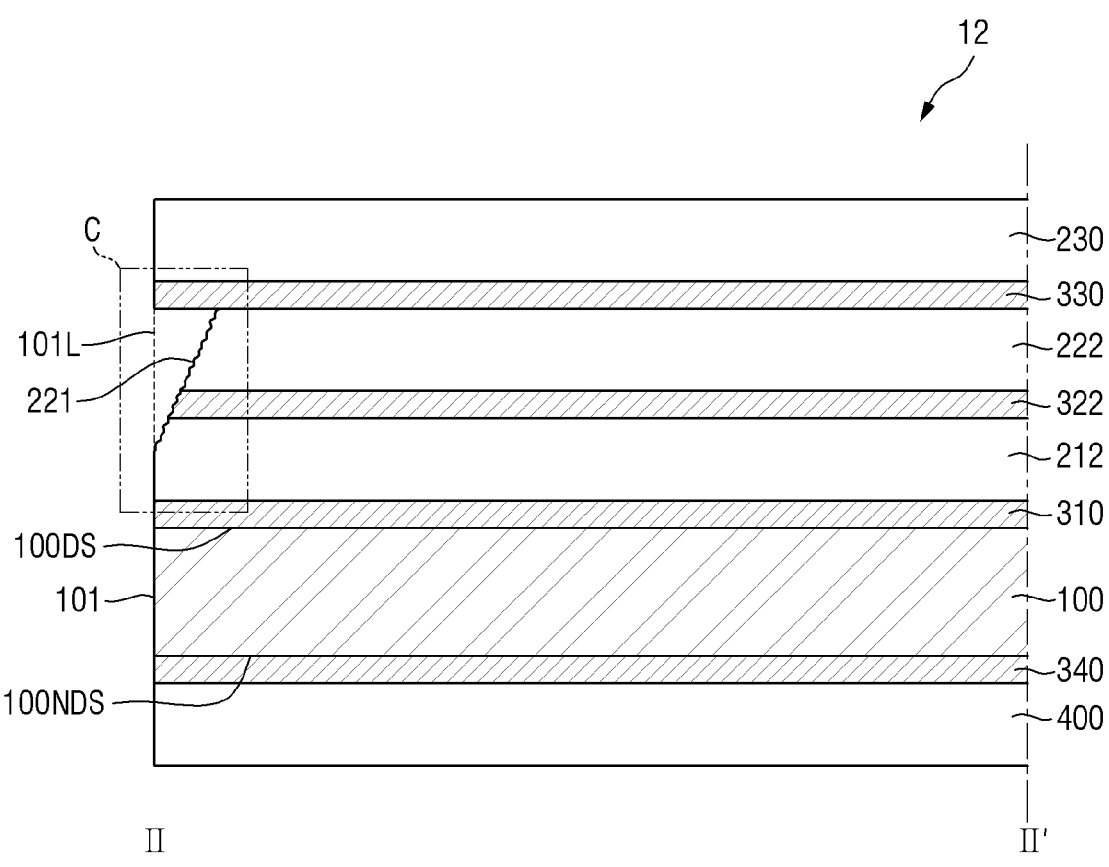
FIG. 16 is a cross-sectional view of another taken along line II-II' in FIG. 9.
Figure 17:
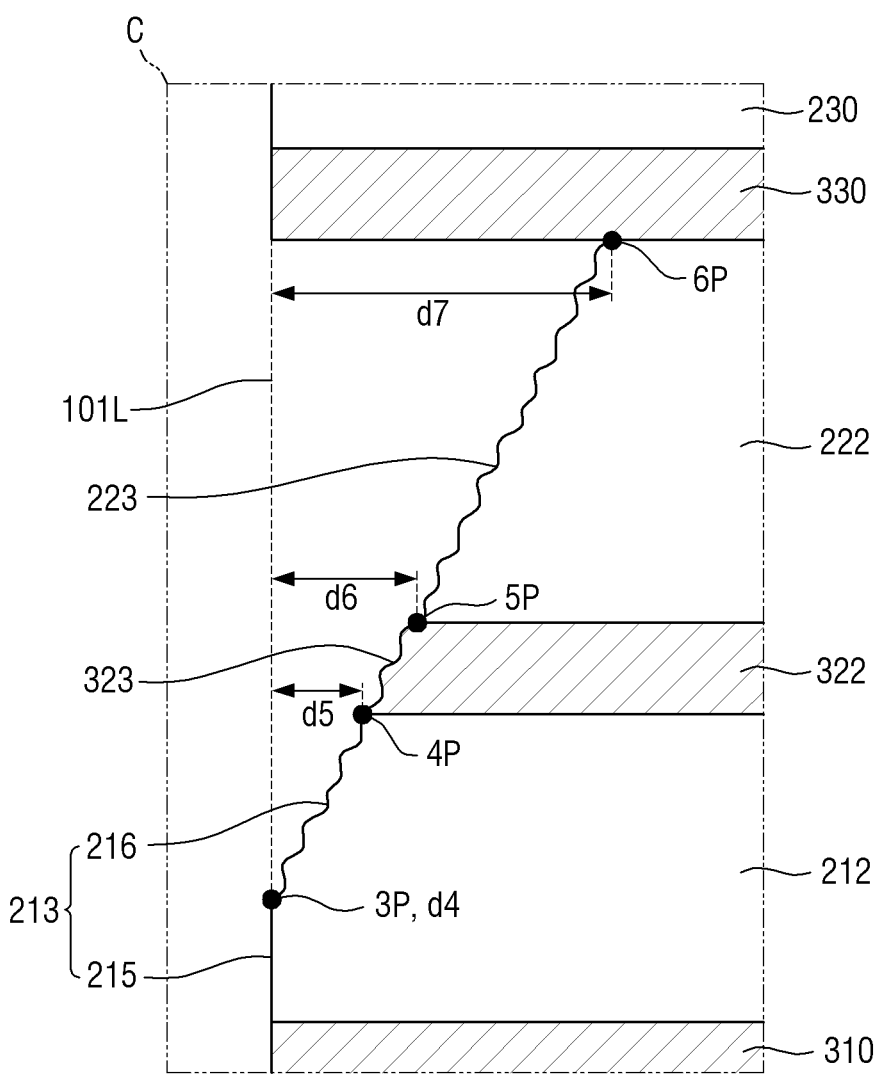
FIG. 17 is an enlarged cross-sectional view of the area C in FIG. 16.

FIG. 16 is a cross-sectional view of another taken along line in FIG. 9, and FIG. 17 is an enlarged cross-sectional view of the area C in FIG. 16.

The embodiment of FIGS. 16 and 17 is different from the aforementioned embodiments of FIGS. 9 to 15 in that outer surfaces of a polarization member and a shock absorbing member coupling member are recessed inwardly. Hereinafter, redundant description is omitted, and mainly the differences from the prior embodiments will be described.

Referring to FIGS. 16 and 17, a display panel 100 may include a display surface 100DS on which an image is displayed. a polarization coupling member 310 may be disposed on the display surface 100DS of the display panel 100, and a polarization member 212 may be disposed on the polarization coupling member 310.

The outer surface 213 of the polarization member 212 may include a first polarization outer surface 215 and a second polarization outer surface 216. The first polarization outer surface 215 may be an outer surface overlapping any extension line 101L of the outer surface 101 of the display panel 100. The second polarization outer surface 216 may be an outer surface not overlapping the extension line 101L. As shown FIG. 16, the second polarization outer surface 216 of the polarization member 212 may have a structure recessed inwardly with respect to the first polarization outer surface 215.

In an embodiment, the polarization member 212 may include a third point 3P of the second polarization outer surface 216, the third point 3P being closest to the display surface 100DS of the display panel 100, and a fourth point 4P of the second polarization outer surface 216, the fourth point 4P being farthest from the display surface 100DS of the display panel 100. With respect to any extension line 101L extending from the outer surface 101 of the display panel 100, the distance d4 between the extension line 101L and the third point 3P may be smaller than the distance d5 between the extension line 101L and the fourth point 4P. That is, moving along the second polarization outer surface 216 of the polarization member 212 further away from the display surface 100DS of the display panel 100, the distance from the extension line 101L increases.

As shown in FIG. 17, the second polarization outer surface 216 of the polarization member 212 may be spaced inwardly from the extension line 101L. The third point 3P of the second polarization outer surface 216 of the polarization member 212 may overlap the extension line 101L, and the fourth point 4P thereof may be spaced inwardly from the extension line 101L.

In some embodiments, the second polarization outer surface 216 of the polarization member 212 may be a substantially irregular (non-flat) and uneven surface. In some other embodiments, the second polarization outer surface 216 of the polarization member 212 may be a substantially flat smooth inclined surface. The second polarization outer surface 216 of the polarization member 212 is not cut by a laser but rather is physically torn off.

As shown in FIG. 17, a shock absorbing member coupling member 322 may be disposed on the polarization member 212. The outer surface 323 of the shock absorbing member coupling member 322 may have a structure recessed inwardly with respect to any extension line 101L.

In an embodiment, the shock absorbing member coupling member 322 may include a fourth point 4P of the outer surface 323 of the shock absorbing member coupling member 322, the fourth point 4P being closest to the display surface 100DS of the display panel 100, and a fifth point 5P of the outer surface 323 of the shock absorbing member coupling member 322, the fifth point 5P being farthest from the display surface 100DS of the display panel 100. Here, since the fourth point 4P of the shock absorbing member coupling member 322 and the fourth point 4P of the polarization member 212 may be located at the same position and shared with each other, the fourth point 4P will be described with the same name. With respect to any extension line 101L extending from the outer surface 101 of the display panel 100, the distance d5 between the extension line 101L and the fourth point 4P may be smaller than the distance d6 between the extension line 101L and the fifth point 5P. That is, as the outer surface 323 of the shock absorbing member coupling member 322 is inclined such that moving further away from the display surface 100DS of the display panel 100 increases, the distance from the extension line 101L and the outer surface 323 may be increased.

As shown in FIG. 17, the outer surface 323 of the shock absorbing member coupling member 322 may be spaced inwardly from any extension line 101L. The fourth point 4P and fifth point 5P of the outer surface 323 of the shock absorbing member coupling member 322 may be spaced inwardly from the extension line 101L.

The outer surface 323 of the shock absorbing member coupling member 322 may be a substantially irregular and uneven surface. In some other embodiments, the outer surface 323 of the shock absorbing member coupling member 322 may be a substantially flat, smooth inclined surface.

As shown in FIG. 17, a shock absorbing member 222 may be disposed on the shock absorbing member coupling member 322. The outer surface 323 of the shock absorbing member 222 may have a structure recessed inwardly with respect to any extension line 101L.

In an embodiment, the shock absorbing member 222 may include a fifth point 5P of the outer surface 323 of the shock absorbing member 222, the fifth point 5P being closest to the display surface 100DS of the display panel 100, and a sixth point 6P of the outer surface 323 of the shock absorbing member 222, the sixth point 6P being farthest from the display surface 100DS of the display panel 100. Here, since the fifth point 5P of the shock absorbing member 222 and the fifth point 5P of the shock absorbing member coupling member 322 may be located at substantially the same position, the fifth point 5P will be described with the same name. With respect to any extension line 101L extending from the outer surface 101 of the display panel 100, the distance d6 between the extension line 101L and the fifth point 5P may be smaller than the distance d7 between the extension line 101L and the sixth point 6P. That is, as the outer surface 323 of the shock absorbing member 222 is further away from the display surface 100DS of the display panel 100, a distance from the extension line 101L may be increased.

As shown in FIG. 17, the outer surface 223 of the shock absorbing member 222 may be spaced inwardly from any extension line 101L. The fifth point 5P and sixth point 6P of the outer surface 223 of the shock absorbing member 222 may be spaced inwardly from the extension line 101L.

The outer surface 223 of the shock absorbing member 222 may be a substantially irregular and uneven surface. In some other embodiments, the outer surface 223 of the shock absorbing member 222 may be a flat smooth inclined surface.

The fifth point 5P of the second polarization outer surface 216 of the polarization member 212 may contact the shock absorbing member coupling member 322, and the sixth point 6P of the outer surface 323 of the shock absorbing member coupling member 322 may contact the shock absorbing member 222. The sixth point 6P of the outer surface 223 of the shock absorbing member 222 may contact the shock absorbing member coupling member 322.

As described above, since the first side portion 760 of the display device 10 is irradiated with a laser relatively small number of times as compared with the second side portion 770 of the display device 10, the laser may not reach the polarization member 220 disposed farthest from the polymer base layer 400 to which the laser is applied. In particular, only a portion of the polarization member 212 may be cut according to the number of laser irradiation. Accordingly, the second polarization outer surface 216 of the polarization member 212, the outer surface 323 of the shock absorbing member coupling member 322, and the outer surface 223 of the shock absorbing member 222, which are disposed on the first side portion 760 of the display device 10, may be physically torn. Further, a laser having a low energy density may be applied a plurality of times during laser cutting. The carbonization of the polymer base layer 400 occurring during laser cutting may be reduced by applying a laser having a low energy density.

The structure of the final laminate 11 may be formed by irradiating the primary laminate 15 with a laser to remove a portion of the primary laminate 15 in the process of manufacturing the display device 10. Hereinafter, an illustrative method of manufacturing a display device 10 using laser cutting will be described.

Figure 18:
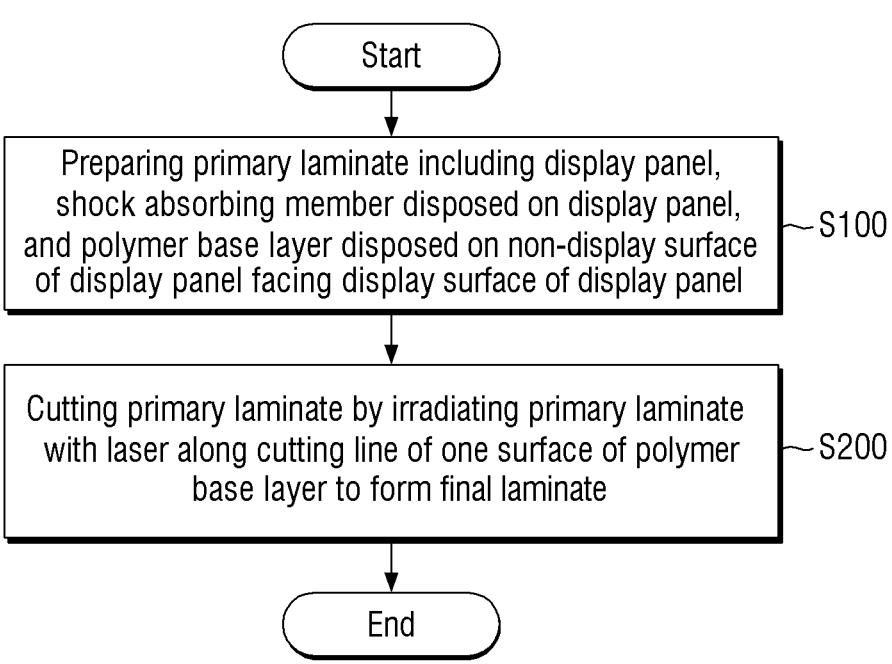
FIG. 18 is a flowchart of a method of manufacturing a display device according the principles of the invention.

FIG. 18 is a flowchart of a method of manufacturing a display device according to the principles of the invention, and FIGS. 19 to 24 are schematic views of an embodiment of a process of manufacturing a display device of FIG. 18.

Referring to FIGS. 18 to 24, the method of manufacturing a display device 10 includes the steps of: (S100) preparing a primary laminate 15 including a display panel 100, a shock absorbing member 200 disposed on a display surface 100DS of the display panel 100, and a polymer base layer 400 disposed on a non-display surface 100NDS of the display panel 100 facing the display surface 100DS of the display panel 100; and (S200) cutting the primary laminate by irradiating the primary laminate with laser along a cutting line LCL of one surface of the polymer base layer 400 to form a final laminate.

The display device may include a final laminate 11 as shown in FIG. 7. The final laminate 11 may be formed by irradiating the primary laminate 15 having a larger planar area with laser to cut the primary laminate 15.

Here, in the step of forming the final laminate 11 by irradiating the primary laminate 15 with a laser, the primary laminate 15 moves in one direction, and at the same time, a laser oscillator LAP to which a laser is applied may move along the cutting line LCL. In this case, the scanning speed of the laser oscillator LAP may be from about 1 m/s to about 7 m/s, and the laser irradiation operation may be repeated about 100 to 200 times. That is, the number of laser irradiation operations may be about 100 to 200 times, where each laser irradiation operation is defined from a start point of the cutting line to an end point of the cutting line.

Hereinafter, a method of manufacturing a display device for each process will be described with reference to FIGS. 19 to 24 together with the flowchart of FIG. 18.

Figure 19:
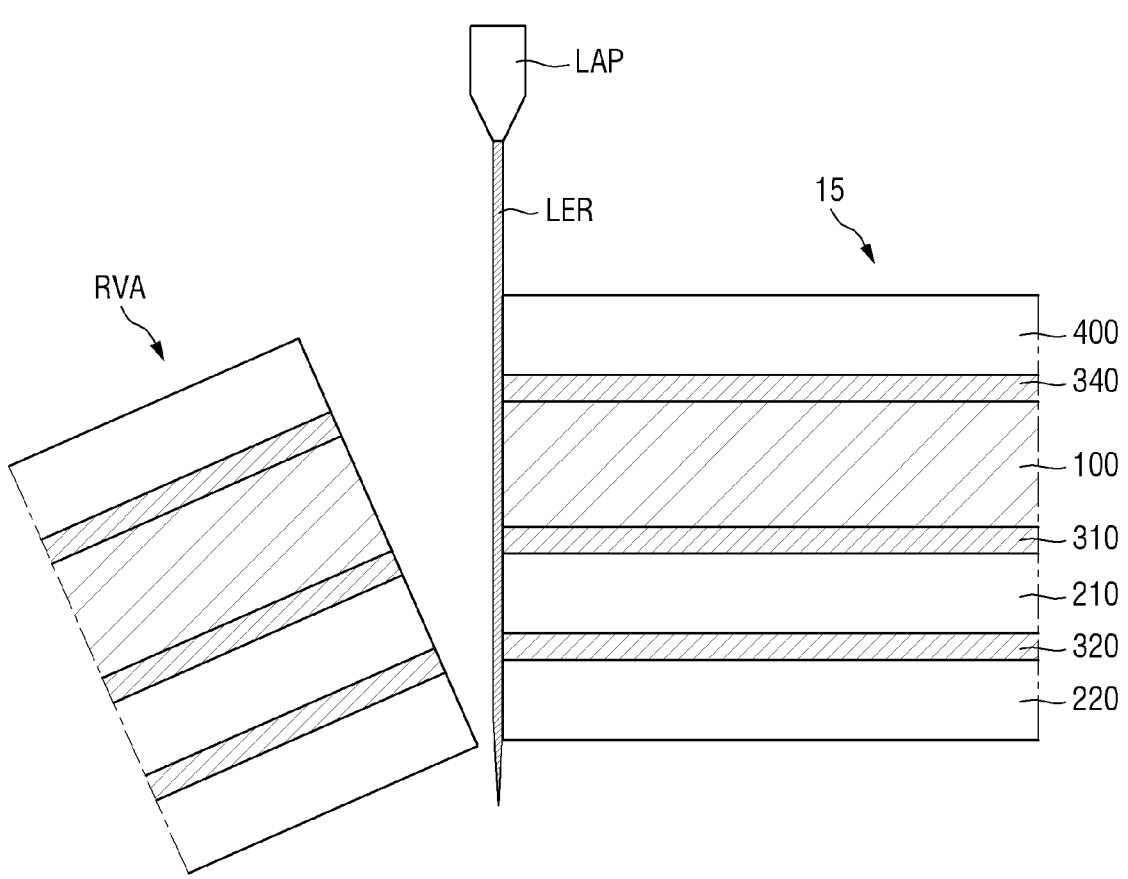
FIGS. 19 to 24 are schematic views of an embodiment of a process of manufacturing a display device of FIG. 18. \
Figure 20:
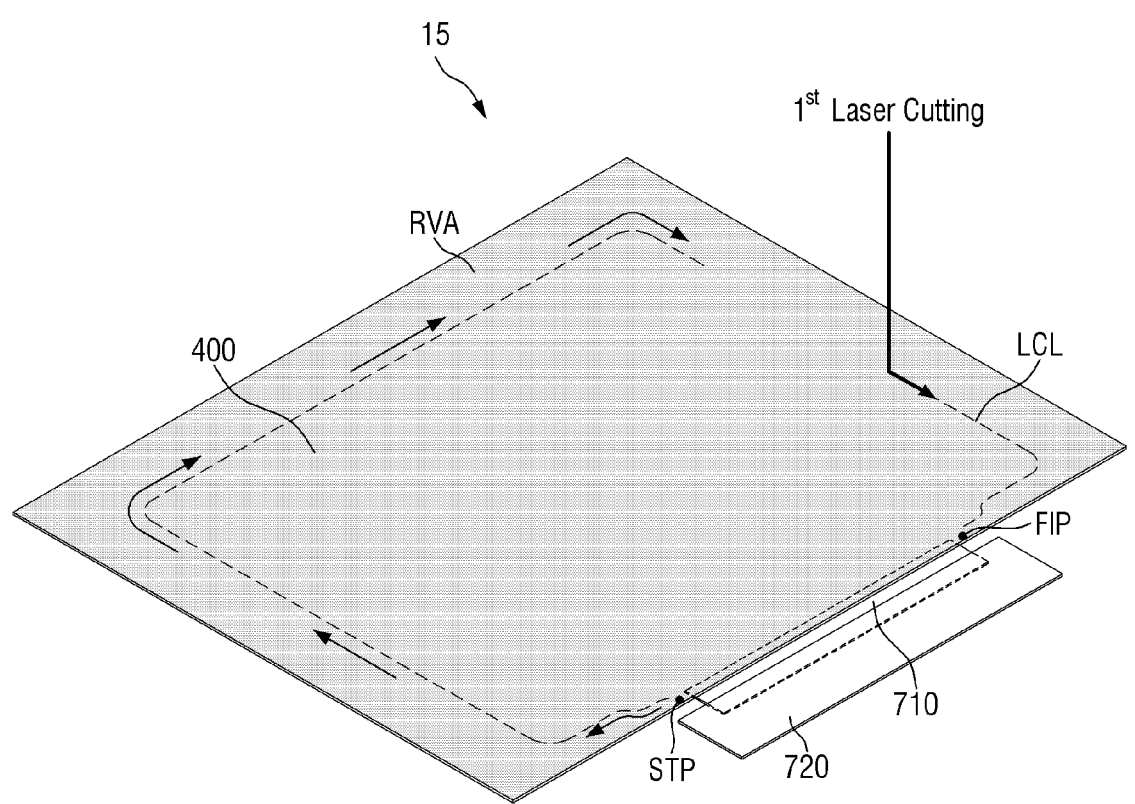

First, referring to FIGS. 19 and 20, a primary laminate 15 including a polymer substrate layer 400, a shock absorbing member 220, and a display panel 100 is prepared (S100). A polarizing member 210 may be disposed between the display panel 100 and the shock absorbing member 220. A polarization member coupling member 310 may be disposed between the display panel 100 and the polarization member 210, a shock absorbing member coupling member 320 may be disposed between the polarization member 210 and the shock absorbing member 220, and a polymer film coupling member 340 may be disposed between the display panel 100 and the polymer base layer 400.

A laser LER is applied onto one surface of the polymer base layer 400, that is, an upper surface facing the non-display surface 100NDS of the display panel 100 in the same direction (S200). The laser LER may be applied to an area having substantially the same area as the final laminate 11. That is, the laser LER may be applied to the cutting line LCL forming the shape of the final laminate 11 of the display device 10. The cutting line LCL may be irradiated by the laser beam such that at least one straight portion and at least one curved portion are formed. The cutting line LCL may include a start point STP at which irradiation of the laser LER starts and an end point FIP at which irradiation of the laser LER ends. The area of the primary laminate 15 located outside the cutting line LCL may be a removal area RVA that is cut and removed by the cutting line LCL.

Figure 21:
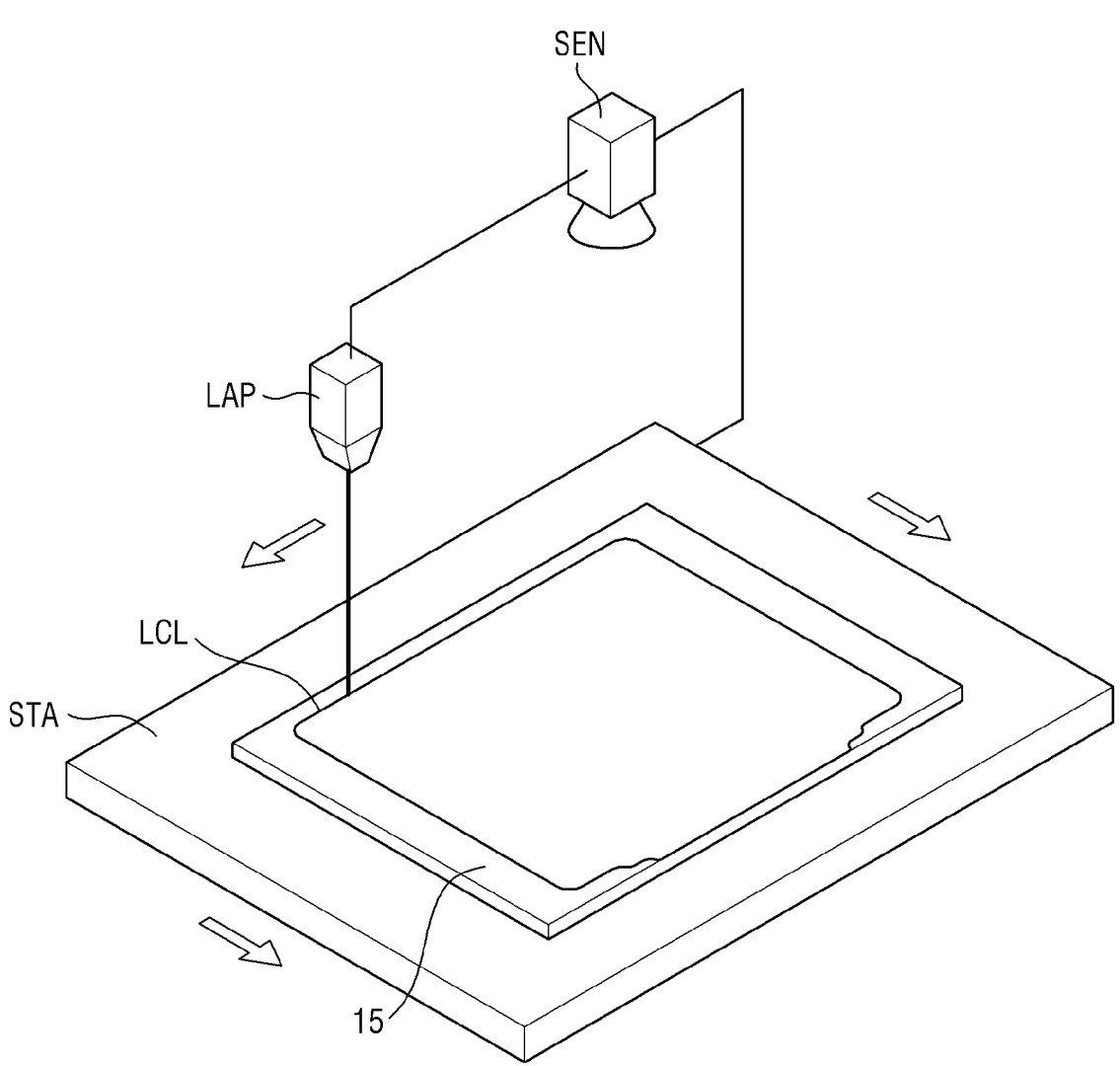

As shown in FIG. 21, the laser irradiation may be performed by a laser irradiation apparatus. Specifically, a primary laminate 15 is placed on and removably attached to a support piece such as a stage STA, and a laser oscillator LAP may be disposed over the primary laminate to face the primary laminate 15. A sensing unit SEN for detecting the movement of the stage STA may be disposed between the stage STA and the laser oscillator LAP. The sensing unit SEN may be a camera.

When the irradiation of the laser LER starts, the stage STA provided with the primary laminate 15 moves in one direction, and at the same time, the laser LER is emitted from the laser oscillator LAP. At this time, the sensing unit SEN detects the movement of the stage STA to determine the position of the primary laminate 15 and transmits the position of the primary laminate 15 to the laser oscillator LAP. The laser oscillator LAP may be synchronized with the position of the stage STA to move while applying the laser along the cutting line LCL of the primary laminate 15. In the determination of the position of the primary laminate 15, a main computer may determine the position of the sensing unit SEN and transmit a position to which the laser oscillator LAP is to move to the laser oscillator LAP. When the movement of the stage STA and the movement of the laser oscillator LAP is simultaneously performed, the process time required for laser cutting may be reduced.

The laser oscillator LAP may be a laser device that applies a laser spot along the cutting line LCL of the primary laminate 15. The scanning speed of the laser oscillator LAP may be about 1 m/s to about 7 m/s. The scanning speed of the laser oscillator LAP may be the speed of moving while irradiating the laser LER. The scanning speed of the laser oscillator LAP may be about 3 m/s to about 5 m/s.

Figure 22:
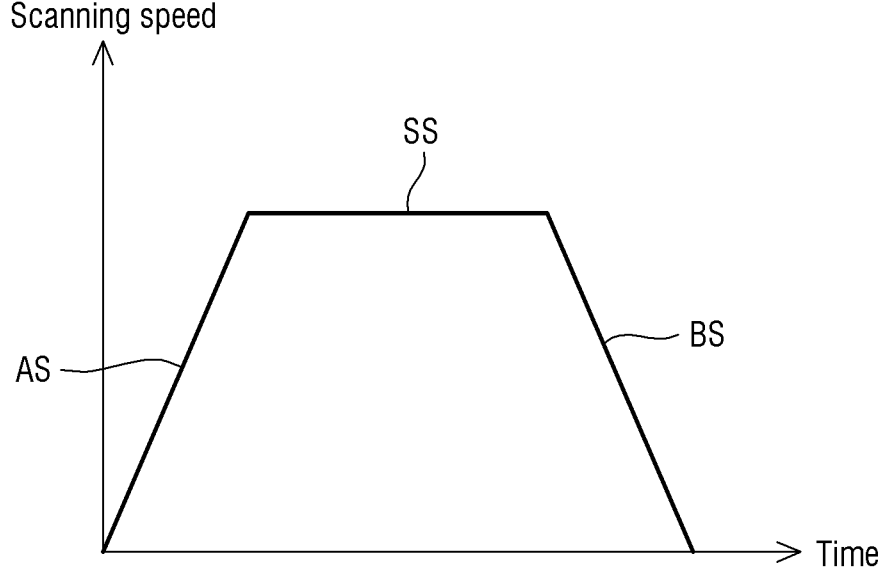

As shown in FIG. 22, the scanning speed of the laser oscillator LAP may be composed of an acceleration section AS, a substantially constant speed section SS, and a deceleration section BS. After the irradiation of the laser oscillator LAP starts, when the scanning speed of the laser oscillator LAP increases in the acceleration section AS and reaches a predetermined scanning speed, the scanning speed of the laser oscillator LAP reaches the substantially constant speed section SS maintaining the scanning speed. During this substantially constant speed section SS, cutting of the primary laminate 15 is performed. When the laser cutting is finished during the substantially constant speed section SS, the scanning speed decreases to reach the deceleration period BS.

The laser LER may be applied at a low energy density of about 12.5 μm or less. When the energy density of the laser LER is high, the carbonized region formed in the polymer substrate layer 400 increases. Therefore, in an embodiment, since the laser LER has an energy density of about 12.5 μm or less, the carbonized region formed in the polymer base layer 400 may be reduced. The energy density of the laser LER may be in the range of about 1 μJ to about 12.5 μJ, and in other embodiments, the energy density of the laser LER may be in the range of about 5 μm to about 8 μJ.

When one irradiation operation of the laser LER is defined from the starting point STP of the cutting line LCL to the ending point FIP, the laser LER may be irradiated about 100 times to about 200 times. That is, the number of laser irradiation operations may be about 100 times to about 200 times. Also, in other embodiments, the number of laser irradiation operations may be about 130 times to about 160 times.

Figure 23:
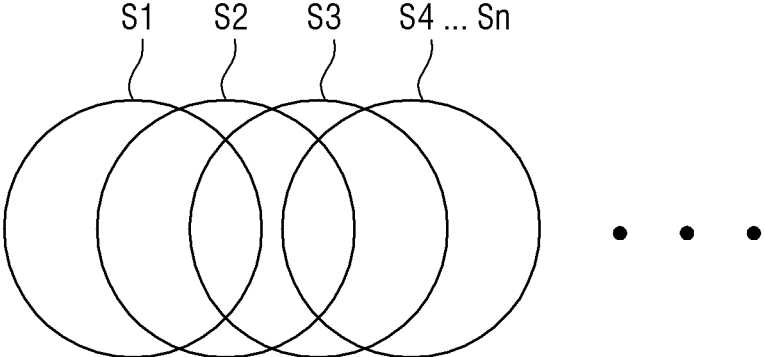

Referring to FIG. 23, the laser oscillator LAP irradiates the cutting line LCL with a laser LER including a plurality of laser spots S1 to Sn. The plurality of laser spots S1 to Sn may overlap each other. For example, in the first laser irradiation process, the (1-1) laser spot S1 and the (1-2) laser spot S2 may partially overlap each other, and the (1-1) and (1-2) laser spots S1 and S2 may overlap the third laser spot S3. Here, the (1-1) laser spot is an initial laser spot and the (1-2) laser spot is next laser spot. The plurality of laser spots S1 to Sn may overlap each other along the cutting line LCL to cut the primary laminate. In the illustrated embodiment, the number of laser irradiation operations may be about 100 times to 200 times. In the first to $n^{th}$ (n is a natural number) laser irradiation operations, laser spots may be applied to the same position. For example, the position of laser spots S1 to Sn such as the (1-1), (1-2), (1-3) . . . and (1-n) in the first laser irradiation operation may be substantially the same as the position of laser spots S1 to Sn such as the (n–1), (n–2), (n–3) . . . and (n–n) in the $n^{th}$ laser irradiation operation.

Referring to FIG. 19 again, in the primary laminate 15 irradiated with the laser LER, the polymer base layer 400, the polymer film coupling member 340, the display panel 100, the polarization member coupling member 310, the polarization member 210, the shock absorbing member coupling member 320, and the shock absorbing member 220 may be cut by the laser.

Figure 24:
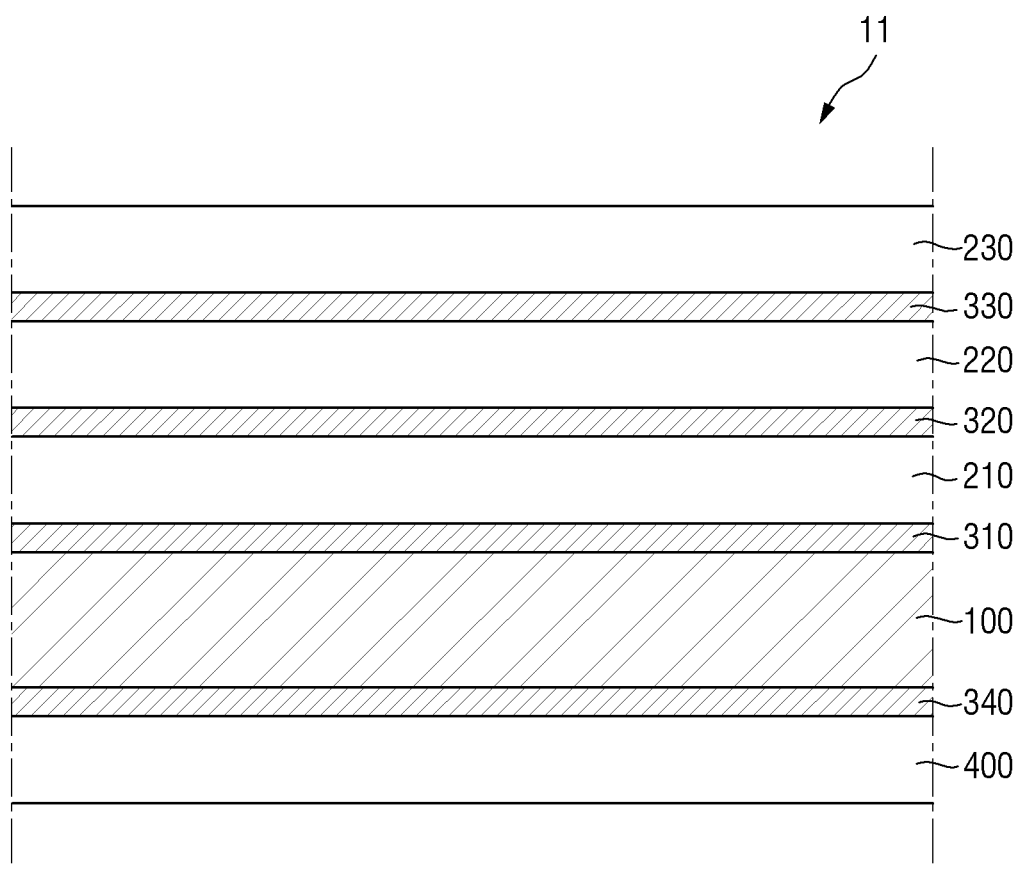

Subsequently, as shown in FIG. 24, a cover window 230 may be attached onto the shock absorbing member 220 through a window coupling member 330, thereby manufacturing a display device 10 including the final laminate 11.

As described above, in an embodiment, the stage STA and the laser oscillator LAP are synchronized with each other to perform laser cutting while moving to each other, thereby reducing the time required for laser cutting. In addition, laser cutting may be performed a plurality of times with a low energy density laser and a high laser scanning speed, thereby minimizing the carbonized region formed in the polymer base layer. Specifically, referring to FIG. 12, since the first side portion 760 of the display device 10 is irradiated with a laser relatively small number of times as compared with the second side portion 770 of the display device 10, the laser may not reach the shock absorbing member 220 disposed farthest from the polymer base layer 400 to which the laser is applied. Accordingly, the outer surface 221 of the shock absorbing member 220 disposed on the first side portion 760 of the display device 10 may be physically torn. That is, the outer surface 221 of the shock absorbing member 220 is not cut by the laser but rather is physically torn off. However, since the first side portion 760 of the display device 10 is only a few to several tens of micrometers as described above, tearing does not produce any adverse effects upon the product.

FIGS. 25 to 28 are schematic views illustrating a process of another embodiment of manufacturing a display device of FIG. 18.

The embodiment of FIGS. 25 to 28 is different from the embodiment of FIGS. 20 to 24 in that the positions of the laser spots in odd numbered laser irradiation processes are different from the positions of the laser spots in even numbered laser irradiation processes. Hereinafter, description of the same process will be omitted to avoid redundancy, and only the differences in the processes will be described in detail. Hereinafter, when the description of the same process is necessary, it will be described with reference to the drawings of FIGS. 20 to 24 described above.

Figure 25:
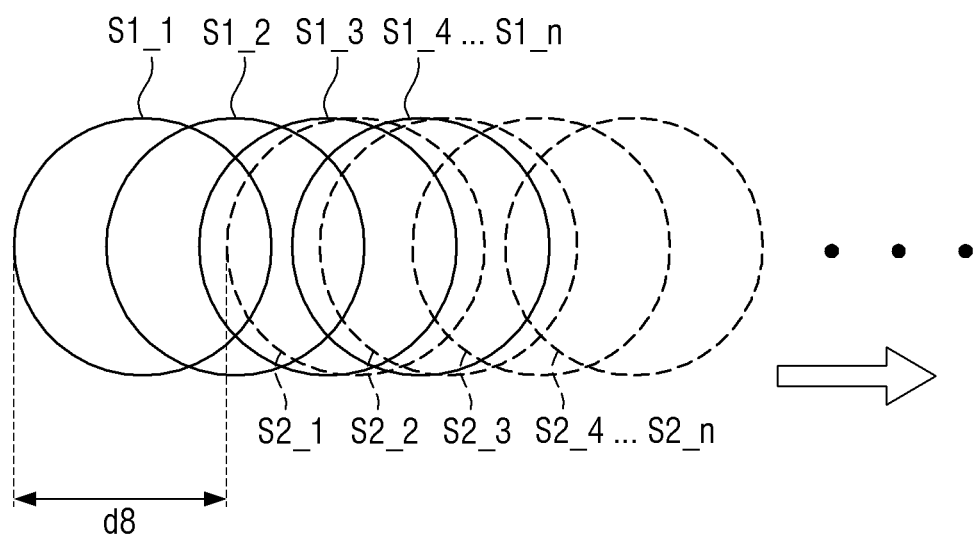
FIGS. 25 to 28 are schematic views of another embodiment of a process of manufacturing a display device of FIG. 18.

Referring to FIG. 25, in another embodiment, the positions of the laser spots in odd numbered laser irradiation processes may be different from the positions of the laser spots in even numbered laser irradiation processes.

Specifically, during the first laser irradiation process, the first laser spots S1_1 to S1_$n$ may partially overlap each other. Subsequently, during the second laser irradiation process, (2-1) laser spot S2_1 of the second laser spots S2_1 to S2_$n$ may be applied such that the second laser spots S2_1 to S2_$n$ partially overlap each other from a position spaced apart from the (1-1) laser spot S1_1 of the first laser spots S1_1 to S1_$n$ by a predetermined distance d8. Here the (2-1) laser spot S2_1 is an initial laser spot of the second laser irradiation process. In this case, the distance d8 between the (1-1) laser spot S1_1 and the (2-1) laser spot S2_1 may be the distance between the end of the (1-1) laser spot S1_1 and end of the (2-1) laser spot S2_1, which are disposed in a direction opposite to the direction of laser irradiation. Next, during the third laser irradiation process, the first laser spots S1_1 to S1_$n$ may be applied to the same location, and during the fourth laser irradiation process, the second laser spots S2_1 to S2_$n$ may be applied to the same location. That is, during the $2n-1^{th}$ laser irradiation processes, laser spots may be applied to the same position, and during $2n^{th}$ laser irradiation processes, laser spots may be applied to the same position.

When the laser spots are continuously applied to the same position when laser irradiation processes is performed a plurality of times, the regions of the polymer base layer 400 corresponding to the laser spots may be carbonized by the generation of high heat due to the energy density of the laser. In an embodiment, during odd numbered laser irradiation processes and even numbered laser irradiation processes, laser spots are applied at regular intervals, so that some of the regions irradiated with laser spots during the odd numbered laser irradiation processes are not irradiated with a laser during the even numbered laser irradiation processes, thereby providing time for the heat generated by the laser to discharge. Accordingly, the occurrence of carbonization of the polymer base layer 400 irradiated with a laser may be reduced.

Figure 26:
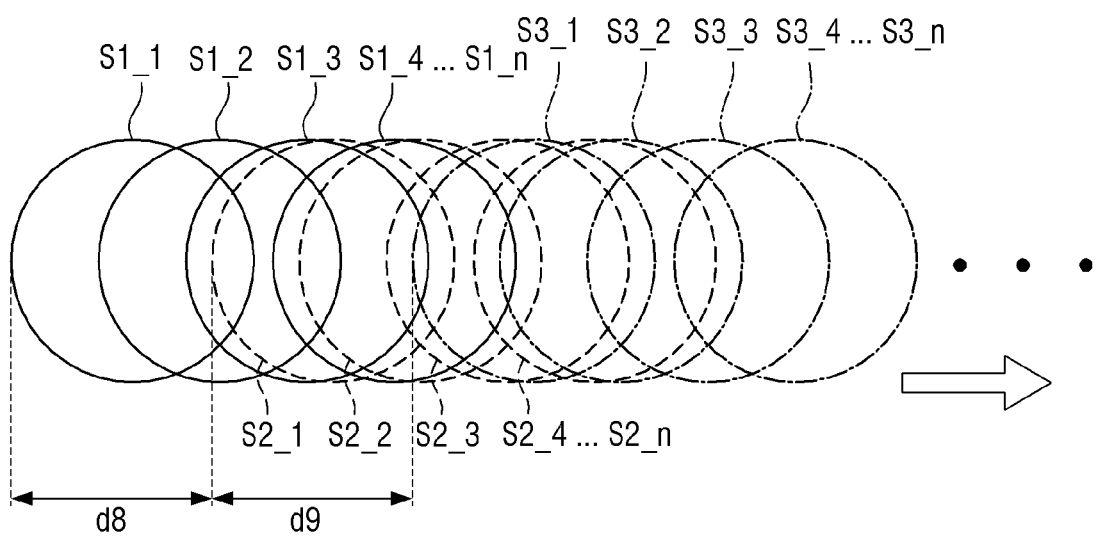

Referring to FIGS. 26, in another embodiment, during the first laser irradiation process, the first laser spots S1_1 to S1_$n$ may partially overlap each other. Subsequently, during the second laser irradiation process, the (2-1) laser spot S2_1 of the second laser spots S2_1 to S2_$n$ may be applied such that the second laser spots S2_1 to S2_$n$ partially overlap each other from a position spaced apart from the (1-1) laser spot S1_1 of the first laser spots S1_1 to S1_$n$ by a predetermined distance d8. Next, during the third laser irradiation process, a (3-1) laser spot S3_1 of the third laser spots S3_1 to S3_$n$ may be applied such that the third laser spots S3_1 to S3_$n$ partially overlap each other from a position spaced apart from the (2-1) laser spot S2_1 of the second laser spots S2_1 to S2_$n$ by a predetermined distance d9. Here the (3-1) laser spot S3_1 is an initial laser spot of the third laser irradiation process. That is, during the $3n-2^{th}$ laser irradiation process, laser spots may be applied to the same position, during $3n-1^{th}$ laser irradiation process, laser spots may be applied to the same position, and during the $3n^{th}$ laser irradiation process, laser spots may be applied to the same position.

Although FIG. 25 shows that laser spots are alternately applied in two laser irradiation cycles and FIG. 26 shows that laser spots are alternately applied in three laser irradiation cycles, the embodiments are not limited thereto. For example, the laser irradiation cycle may be four or more cycles.

Referring to FIGS. 20 and 25, in the laser irradiation, an initial laser spot from the start point STP may be applied. The (1-1) laser spot S1_1 during the first laser irradiation process and the (2-1) laser spot S2_1 during the second laser irradiation process may be spaced apart from each other at regular intervals and may partially overlap each other. At this time, the second laser spots S2_1 to S2_$n$ irradiated with the second laser may overlap the first laser spots S1_1 to S1_$n$ of the first laser, so that a sufficient number of laser irradiation processes may be performed. In contrast, a portion of each of the (1-1), (1-2) and (1-3) laser spots S1_1, S1_2, and S1_3 irradiated with the first laser does not overlap the second laser spots S2_1 to S2_$n$, so that the number of laser irradiations may be relatively small. That is, the number of laser irradiation by a distance d8 between the (1-1) laser spot S1_1 and the (2-1) laser spot S2_1 may be relatively small.

Figure 27:
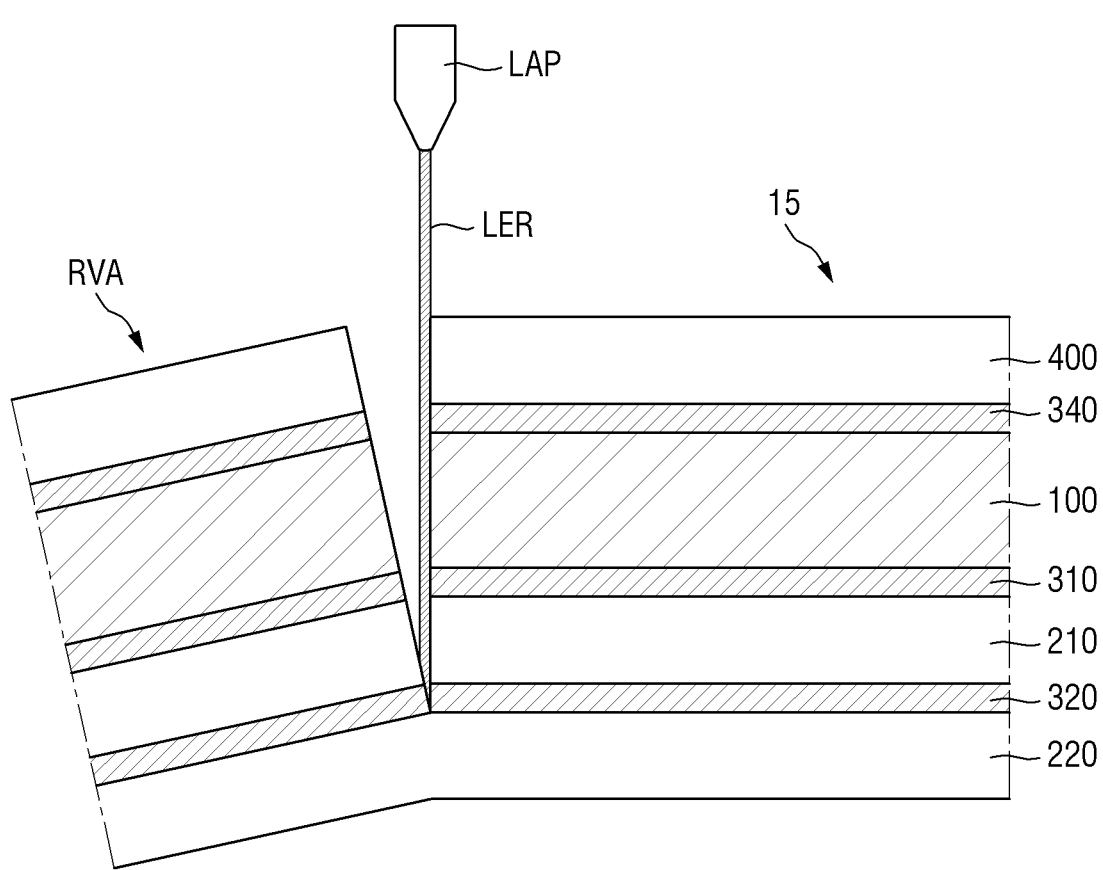
Figure 28:
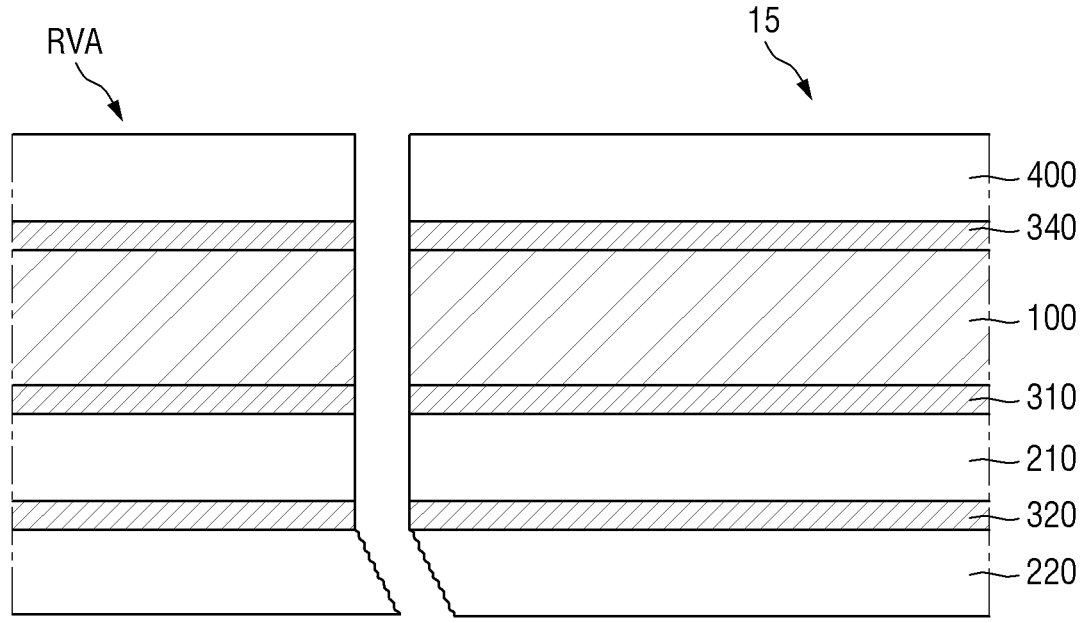

Referring to FIGS. 20, 27 and 28, in the area adjacent to the start point STP of the primary laminate 15, the shock absorbing member 220 disposed at the bottom may not be cut. However, as described above, since the distance d8 between the (1-1) laser spot S1_1 and the (2-1) laser spot S2_1 is only several micrometers, the shock absorbing member 220 may be physically separated as shown in FIG. 27 be tearing off or the like. Finally, the final laminate 11 may be formed by laser cutting the primary laminate 15.

Referring to FIG. 12 above, the display device 10 including the final laminate 11 may be manufactured in this manner to have a structure in which the outer edge surface 221 of the shock absorbing member 220 is recessed inwardly from any extension line 101L has been physically separated, e.g., by tearing, to form the outer edge surface 221, as discussed below. For example, the outer surface 221 of the shock absorbing member 220 may be inclined as shown in FIG. 12 due to being physically separated without being cut by a laser.

In some embodiments, the outer surface 221 of the shock absorbing member 220 may be a substantially irregular and uneven surface because the outer surface 221 of the shock absorbing member 220 may be physically torn off without being cut by a laser. The first side portion 760 of the display device 10 is irradiated with a laser having a low energy density as compared with the second side portion 770 thereof, so that a laser may not reach the shock absorbing member 220 disposed farthest from the polymer base layer 400 to which the laser is applied. Accordingly, the outer surface 221 of the shock absorbing member 220 disposed on the first side portion 760 of the display device 10 may be physically torn. However, since the first side portion 760 of the display device 10 is only a few to several tens of micrometers as described above, tearing does not produce any adverse effects with the product. Further, a laser having a low energy density may be applied a plurality of times during laser cutting. A laser having a low energy density may be applied, thereby reducing the carbonization of the polymer base layer 400 that may occur during laser cutting.

In an embodiment, a polarization member 210 may be disposed between the shock absorbing member 220 and the display panel 100, and a shock absorbing member coupling member 320 may be disposed between the shock absorbing member 220 and the polarizing member 210 to attach the shock absorbing member 220 and the polarizing member 210. The shock absorbing member 220 may include one surface 220LS contacting the shock absorbing member coupling member 320. As shown in FIG. 12, the outer surface 221 of the shock absorbing member 220 may be spaced inwardly from the outer surface 321 of the shock absorbing member coupling member 320. Further, one surface 220LS of the shock absorbing member 220 may be spaced inwardly from the outer surface 321 of the shock absorbing member coupling member 320.

In an embodiment, the shock absorbing member 220 may include an upper surface 220US and opposed a lower surface 220LS, which face each other. A cover window 230 may be disposed on the upper surface 220US of the shock absorbing member 220, and a window coupling member 330 may be disposed between the upper surface 220US of the shock absorbing member 220 and the cover window 230. The upper surface 220US of the shock absorbing member 220 may contact the window coupling member 330.

As shown in FIG. 12, the outer surface 231 of the cover window 230 and the outer surface 331 of the window coupling member 330 may overlap extension line 101L extending from the outer surface 101 of the display panel 100. The outer surface 221 of the shock absorbing member 220 may be recessed inwardly from the outer surface 231 of the cover window 230 and the outer surface 331 of the window coupling member 330.

In an embodiment, the first point 1P of the outer surface 221 of the shock absorbing member 220 may contact the shock absorbing member coupling member 320, and the second point 2P of the outer surface 221 of the shock absorbing member 220 may contact the window coupling member 330. With respect to the extension line 101L extending from the outer surface 101 of the display panel 100, the distance d2 between the extension line 101L and the first point 1P may be smaller than the distance d3 between the extension line 101L and the second point 2P.

As shown in FIG. 13, in another embodiment, the outer surface 221 of the shock absorbing member 220 may be formed as a relatively smooth inclined surface unlike in FIGS. 11 and 12. However, the embodiments are not limited thereto. The shape of the outer surface 221 may be various and non-uniform because the outer surface 221 of the shock absorbing member 220 may be physically torn off without being cut by a laser.

As described above, according to the principles and embodiments of the invention, a stage and a laser oscillator may move in synchronization with each other to perform laser cutting, thereby reducing the time required for laser cutting. Further, laser cutting may be performed a plurality of times with a laser having low energy density at a high scanning speed, thereby minimizing a carbonized region formed in a polymer base layer.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A method of manufacturing a display device, the method comprising:

providing a primary member of a display panel having a display surface and a non-display surface, a shock absorber disposed on the display surface, and a polymer base disposed on the non-display surface;

cutting the primary member by irradiating the primary member with a laser along a cutting line of one surface of the polymer base without cutting through an outer surface of the shock absorber; and physically tearing off an outer surface of the shock absorber to form a final member without the laser, wherein, during laser irradiation, the primary member moves in one direction, and simultaneously a laser oscillator to which the laser is applied moves along the cutting line, and wherein the scanning speed of the laser oscillator is about 1 m/s to about 7 m/s, and the laser irradiation proceeds repetitively from a start point of the cutting line to an end point of the cutting line from about 100 times to about 200 times.

2. The method of claim 1, wherein the primary member comprises a primary laminate mounted on a support piece, the primary laminate is moved by movement of the support piece, a position of the primary laminate is determined by detecting the movement of the support piece, and the laser oscillator moves along the cutting line according to the position of the primary laminate.

3. A method of manufacturing a display device, the method comprising:

providing a primary member of a display panel having a display surface and a non-display surface, a shock absorber disposed on the display surface, and a polymer base disposed on the non-display surface;

cutting the primary member by irradiating the primary member with a laser along a cutting line of one surface of the polymer base; and physically tearing off an outer surface of the shock absorber to form a final member, wherein, during laser irradiation, the primary member moves in one direction, and simultaneously a laser oscillator to which the laser is applied moves along the cutting line, and wherein the scanning speed of the laser oscillator is about 1 m/s to about 7 m/s, and the laser irradiation proceeds repetitively from a start point of the cutting line to an end point of the cutting line from about 100 times to about 200 times, wherein, during the laser irradiation, a $2n-1^{th}$ (n is a natural number) laser cutting process is performed by applying the laser including a plurality of first laser spots along the cutting line; and a $2n^{th}$ laser cutting process is performed by applying the laser including a plurality of second laser spots along the cutting line.

4. The method of claim 3, wherein the plurality of first laser spots are applied at regular intervals, the plurality of second laser spots are applied at regular intervals, and an initial laser spot of the plurality of first laser spots partially overlap an initial laser spot of the plurality of second laser spots.

5. The method of claim 4, wherein an overlapping area rate of the initial laser spot of the plurality of first laser spots and the initial laser spot of the plurality of second laser spots is about 20% or less.

6. A method of manufacturing a display device, the method comprising:

providing a primary member of a display panel having a display surface and a non-display surface, a shock absorber disposed on the display surface, and a polymer base disposed on the non-display surface;

cutting the primary member by irradiating the primary member with a laser along a cutting line of one surface of the polymer base; and physically tearing off an outer surface of the shock absorber to form a final member, wherein, during laser irradiation, the primary member moves in one direction, and simultaneously a laser oscillator to which the laser is applied moves along the cutting line, and wherein the scanning speed of the laser oscillator is about 1 m/s to about 7 m/s, and the laser irradiation proceeds repetitively from a start point of the cutting line to an end point of the cutting line from about 100 times to about 200 times, wherein, during the laser irradiation, a $3n\text{-}2^{th}$ (n is a natural number) laser cutting process is performed by applying the laser including a plurality of first laser spots along the cutting line;

a $3n\text{-}1^{th}$ laser cutting process is performed by applying the laser including a plurality of second laser spots along the cutting line; and a $3n^{th}$ laser cutting process is performed by applying the laser including a plurality of third laser spots along the cutting line.

7. The method of claim 6, wherein the plurality of first laser spots are applied at regular intervals, the plurality of second laser spots are applied at regular intervals, and the plurality of third laser spots are applied at regular intervals;

an initial laser spot of the plurality of first laser spots partially overlap an initial laser spot of the plurality of second laser spots, and the initial laser spot of the plurality of second laser spots partially overlap an initial laser spot of the plurality of third laser spots; and an overlapping area rate of the initial laser spot of the plurality of first laser spots and the initial laser spot of the plurality of second laser spots is about 20% or less, and an overlapping area rate of the initial laser spot of the plurality of second laser spots and the initial laser spot of the plurality of third laser spots is about 20% or less.

\* \* \* \* \*